(12) United States Patent
Sato

(10) Patent No.: US 6,486,052 B1
(45) Date of Patent: Nov. 26, 2002

(54) PACKAGE HAVING TERMINATED PLATING LAYER AND ITS MANUFACTURING METHOD

(75) Inventor: Ryoji Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/642,806

(22) Filed: Aug. 22, 2000

(30) Foreign Application Priority Data

Aug. 16, 1999 (JP) .......................................... 11-240607

(51) Int. Cl.[7] .......................... H01L 23/02; H01L 21/44
(52) U.S. Cl. ........................ 438/613; 257/693; 257/698; 257/700; 257/777; 257/778; 438/106; 438/125; 438/612; 438/614
(58) Field of Search ................................ 257/678, 680, 257/690, 698, 700, 777, 778, 779, 780, 781, 693; 438/106–111, 113, 125–126, 612–614

(56) References Cited

U.S. PATENT DOCUMENTS

| 4,498,122 A | * | 2/1985 | Rainal ........................ 361/414 |
| 4,827,327 A | * | 5/1989 | Miyauchi et al. .............. 357/71 |
| 5,284,725 A | * | 2/1994 | Takatsu ........................ 430/5 |
| 5,726,489 A | * | 3/1998 | Matsuda et al. ............. 257/659 |
| 5,851,911 A | * | 12/1998 | Farnworth .................... 438/614 |
| 6,077,766 A | * | 6/2000 | Schesta et al. .............. 438/618 |
| 6,117,705 A | * | 9/2000 | Glenn et al. ................. 438/106 |
| 6,181,004 B1 | * | 1/2001 | Koontz et al. .............. 257/691 |

FOREIGN PATENT DOCUMENTS

| JP | A 64-50450 | | 2/1989 |
| JP | 64-50450 | | 2/1989 |
| JP | 5-95025 | | 4/1993 |
| JP | 8-288422 | | 11/1996 |
| JP | 10173087 | * | 6/1998 |

* cited by examiner

Primary Examiner—Tuan H. Nguyen
Assistant Examiner—Thanhha Pham
(74) Attorney, Agent, or Firm—Young & Thompson

(57) ABSTRACT

In a package for mounting a semiconductor device and a bump, an interposer substrate has a first surface for mounting the semiconductor device. A wiring layer capable of being connected to the semiconductor device, a terminal connected to the wiring layer for mounting the bump, and a plating layer are formed on a second surface of the interposer substrate. The plating layer is connected to one of the terminal and the wiring layer. The plating layer is terminated within the interposer substrate.

9 Claims, 34 Drawing Sheets

◯ Au PLATING LAYER 107a

Fig. 5A
PRIOR ART
Fig. 5B
PRIOR ART
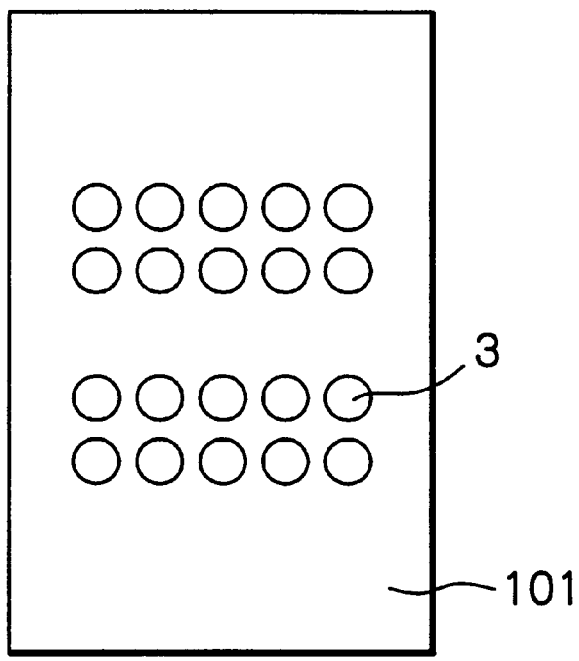
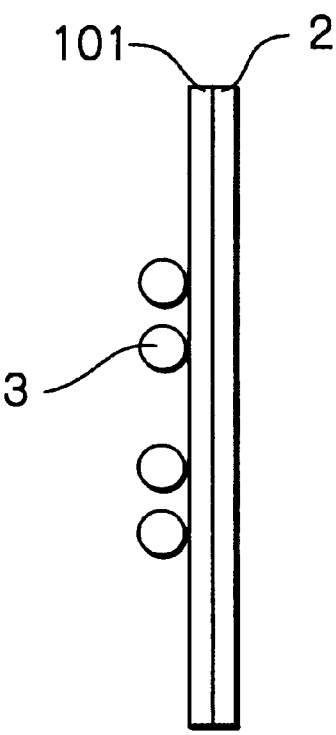
Fig. 5C
PRIOR ART
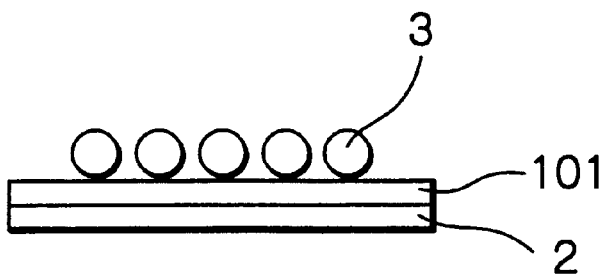

Au PLATING LAYER 17a

Au PLATING LAYER 17a

Au PLATING LAYER 27a

Au PLATING LAYER 27a

Au PLATING LAYER 27a

Au PLATING LAYER 27a

Au PLATING LAYER 27a

PACKAGE HAVING TERMINATED PLATING LAYER AND ITS MANUFACTURING METHOD

BACKGROUND OF THE INVENTION

1. Field of the Invention

The present invention relates to a package for mounting a semiconductor device (chip) and a solder bump, and its manufacturing method.

2. Description of the Related Art

Generally, when a semiconductor chip and solder bumps are mounted on terminals of a package by soldering or the like, it is impossible to mount the semiconductor chip and the solder bumps directly on the terminals, because the terminals are not made of rust proof material. Therefore, it is essential to electroplate Au or Ni/Au on the terminals before the semiconductor chip and the solder bumps are mounted.

In a prior art method for manufacturing a package for mounting a semiconductor device and a bump, an interposer substrate having a first surface for mounting the semiconductor device is prepared. Then, a conductive layer is formed on a second surface of the interposer substrate, and the conductive layer is patterned to form a wiring layer capable of being connected to the semiconductor device, a terminal connected to the wiring layer, and a plating layer connected to the terminal and terminated at an end of the package. Then, a mask layer having an opening exposing the terminal is coated, and the terminal is electroplated by supplying a current from the plating layer to the terminal (see: JP-A-5-95025 & JP-A-8-288422). This will be explained later in detail.

In the above-described prior art method, however, the plating layer is finally left. Therefore, when the operation frequency of this semiconductor chip is higher, the amount of signals reflected by the plating layer is increased. Also, the parasitic capacitance of the plating layer adversely affects signals from the semiconductor chip to the solder bump and vice versa.

SUMMARY OF THE INVENTION

It is an object of the present invention to provide a package and its manufacturing method capable of decreasing the amount of reflected signals and reducing the parasitic capacitance by plating layers.

According to the present invention, in a package for mounting a semiconductor device and a bump, an interposer substrate has a first surface for mounting the semiconductor device. A wiring layer capable of being connected to the semiconductor device, a terminal connected to the wiring layer for mounting the bump, and a plating layer are formed on a second surface of the interposer substrate. The plating layer is connected to one of the terminal and the wiring layer. The plating layer is terminated within the interposer substrate.

Also, in a method for manufacturing a package for mounting a semiconductor device and a bump, an interposer substrate having a first surface for mounting the semiconductor device is prepared. Then, a conductive layer is formed on a second surface of the interposer substrate, and the conductive layer is patterned to form a wiring layer capable of being connected to the semiconductor device, a terminal connected to the wiring layer, and a plating layer connected to the terminal or the wiring layer and terminated at an end of the package. Then, a mask layer having an opening exposing the terminal is coated, and the terminal is electroplated by supplying a current from the plating layer to the terminal. Finally, the plating layer is terminated within the package.

BRIEF DESCRIPTION OF THE DRAWINGS

The present invention will be more clearly understood from the description set forth below, as compared with the prior art, with reference to the accompanying drawings, wherein:

FIG. 5A is a plan view illustrating the BGA type semiconductor device obtained by the method as illustrated in FIGS. 1A through 1I;

FIGS. 5B and 5C are side views of the device of FIG. 5A;

DESCRIPTION OF THE PREFERRED EMBODIMENTS

Before the description of the preferred embodiments, a prior art method for manufacturing a ball grid array (BGA) type semiconductor device will be explained with reference to FIGS. 1A through 1I.

Figure 2:
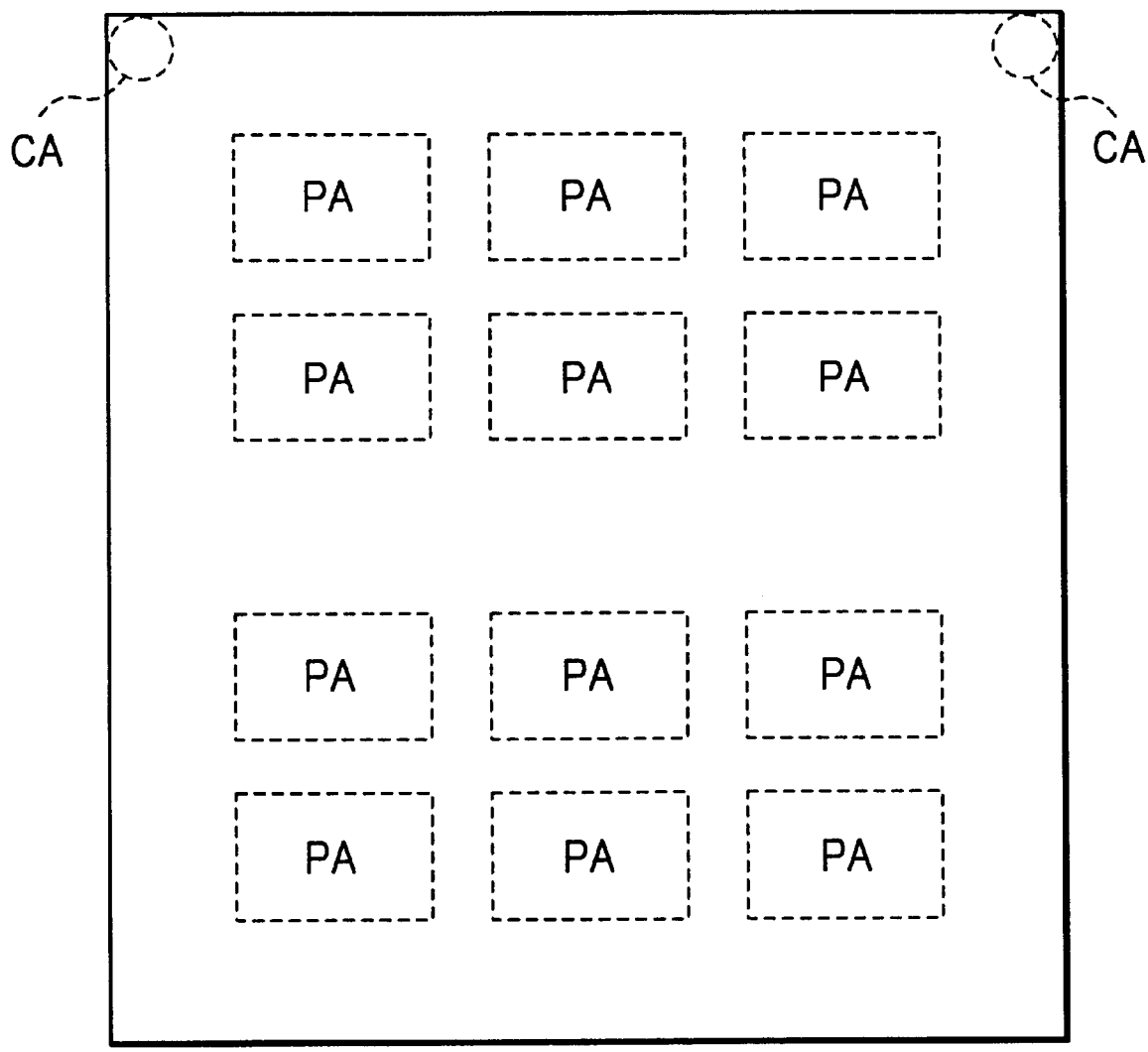
FIG. 2 is a plan view illustrating the interposer substrate of FIG. 1A.

Initially, an interposer substrate 101 made of polyimide as illustrated in FIG. 2 is prepared. Note that a dotted area PA designates a package area, and PS designates a current supply area.

Figure 1A:
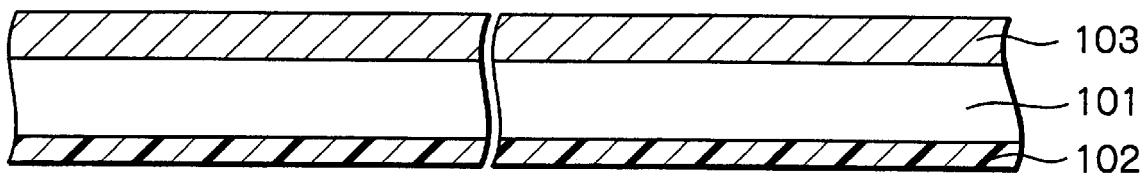
FIGS. 1A through 1I are cross-sectional views for explaining a prior art method for manufacturing a BGA type semiconductor device.

Next, referring to FIG. 1A, an adhesive layer 102 is coated on a back surface of the interposer substrate 101. Then, a copper foil layer 103 is formed on a front surface of the interposer substrate 101.

Figure 1B:
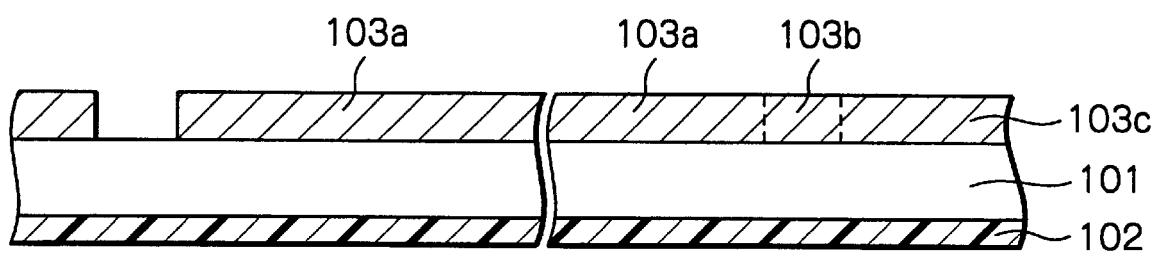
Figure 3:
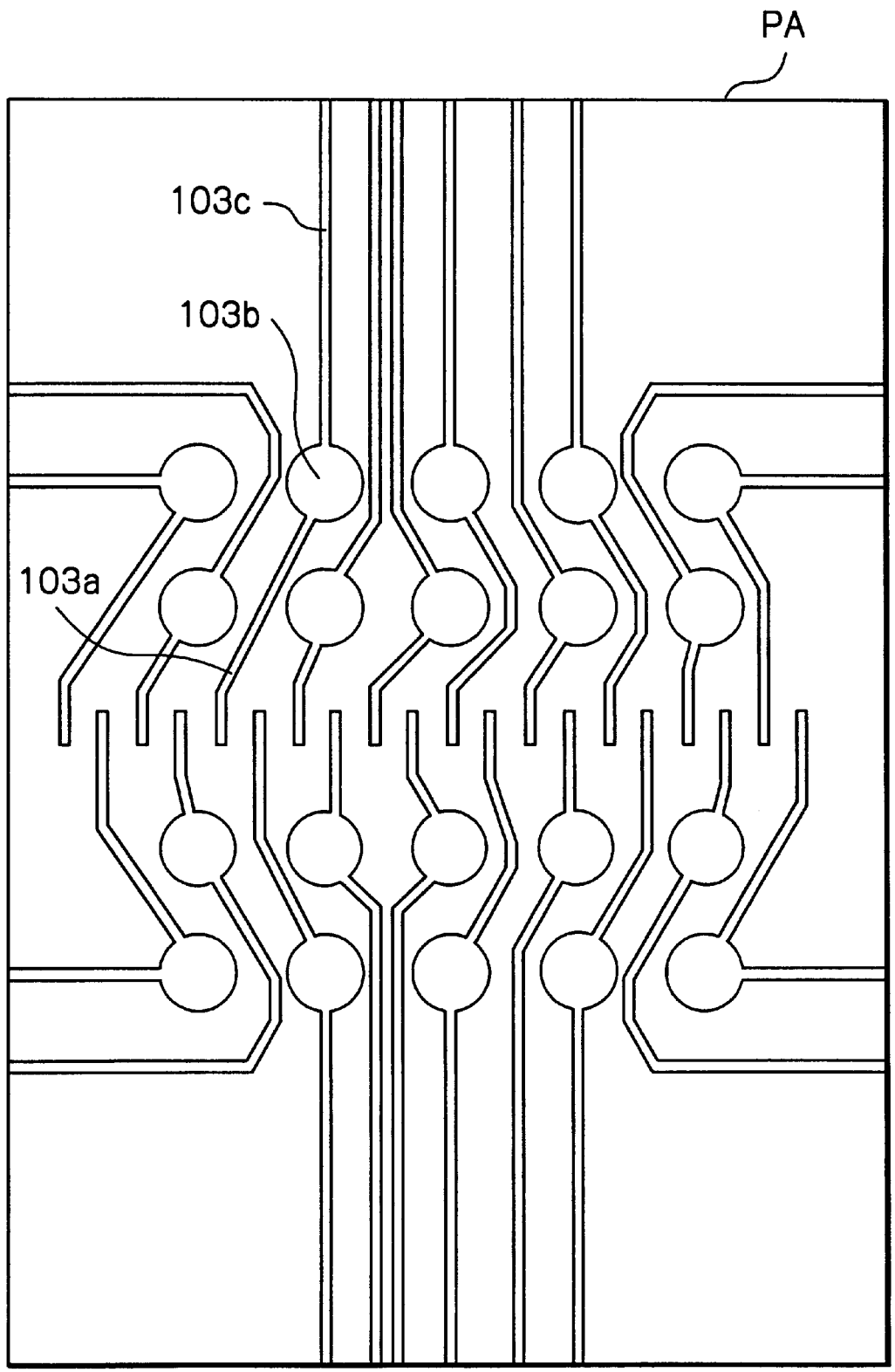
FIG. 3 is a plan view illustrating the pattern layer of FIG. 1B.

Next, referring to FIG. 1B, the copper foil layer 103 is patterned by a photolithography and etching process to form a pattern layer as illustrated in FIG. 3. Each pattern of the pattern layer is constructed by wiring layers 103a, terminals 103b for mounting solder balls (outer bumps) and plating layers 103c.

Figure 1C:
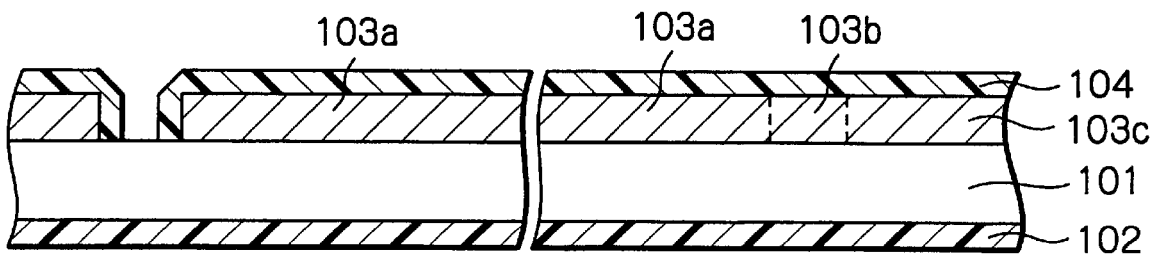

Next, referring to FIG. 1C, a solder resist layer 104 is coated on the entire front surface.

Figure 1D:
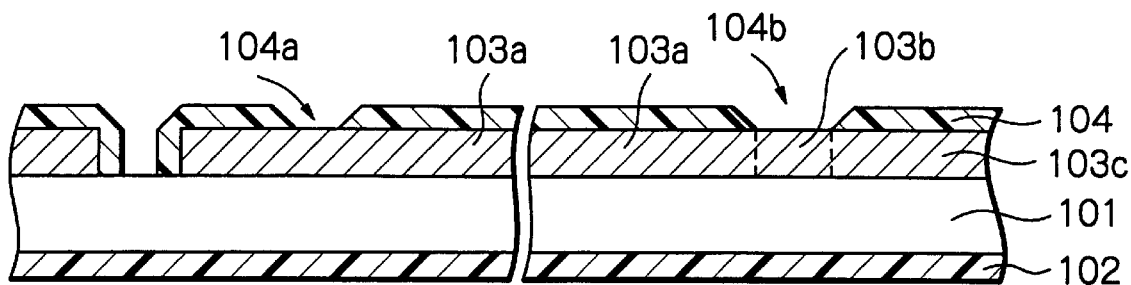

Next, referring to FIG. 1D, openings 104a and 104b are perforated in the solder resist layer 104. The opening 104a is used for forming an innerhole INH (see FIG. 1E), and the opening 104b exposes the terminal 103b.

Figure 1E:
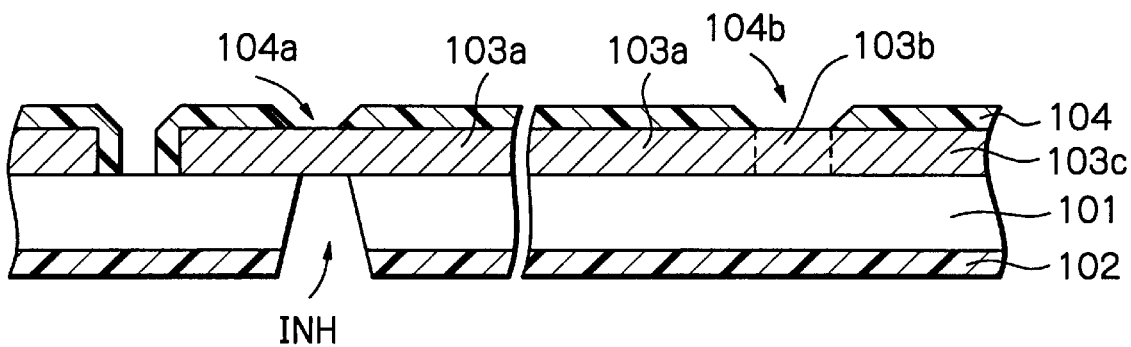

Next, referring to FIG. 1E, an innerhole INH is perforated in the adhesive layer 102 and the interposer substrate 101 by a laser trimming process or the like. Note that the innerhole INH does not penetrate the wiring layer 103a. Also, the innerhole INH corresponds to a terminal of a semiconductor chip which will be mounted on the back of the interposer substrate 101.

Figure 1F:
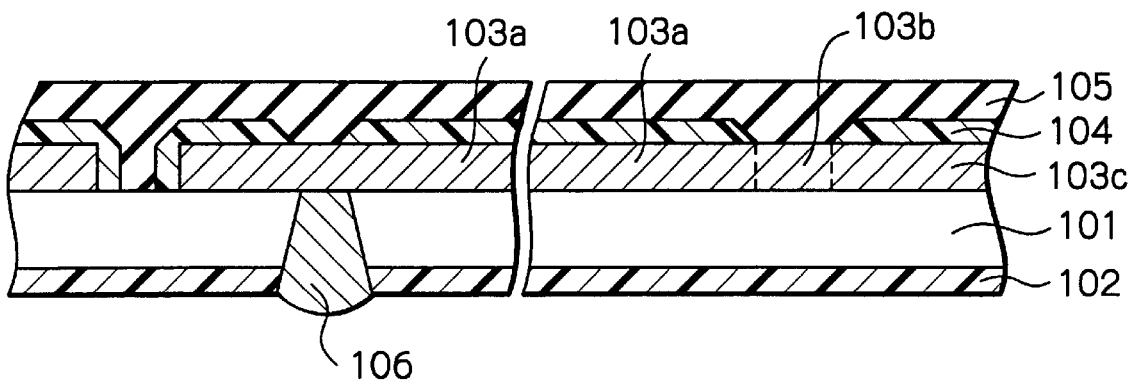

Next, referring to FIG. 1F, a plating mask layer 105 made of insulating material is coated on the entire front surface. Then, an electroplating process is carried out by supplying a current to the pattern layer (103a, 103b, 103c) from the current supply area CA of FIG. 2 while the interposer substrate 101 is dipped into a plating solution. As a result, a bump (plug layer) 106 is buried in the innerhole INH.

Figure 1G:
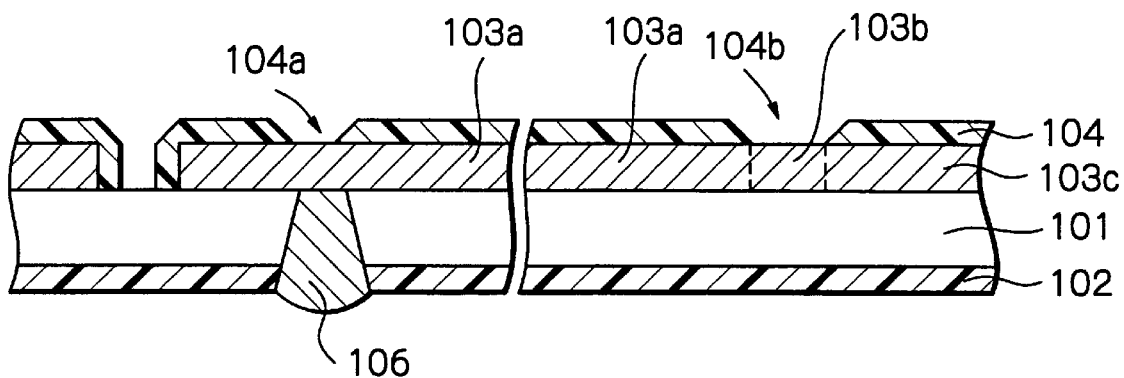

Next, referring to FIG. 1G, the plating mask layer 105 is removed.

Figure 1H:
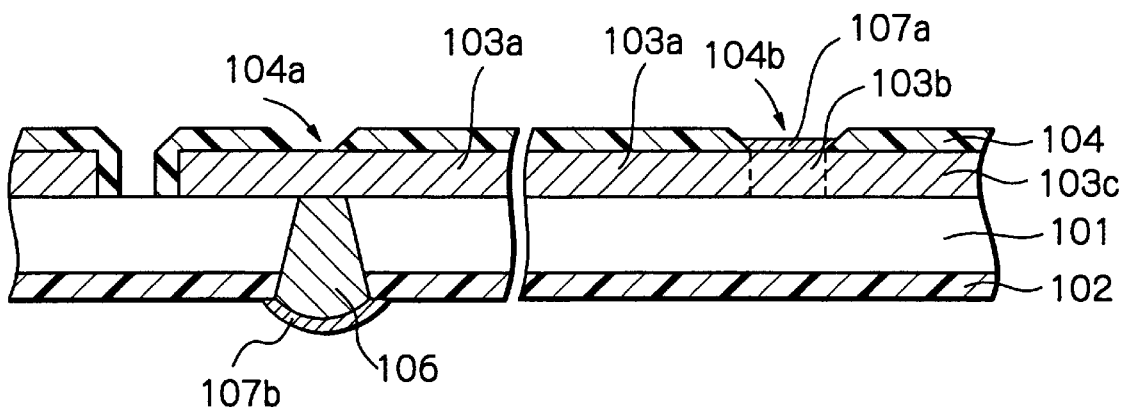
Figure 4:
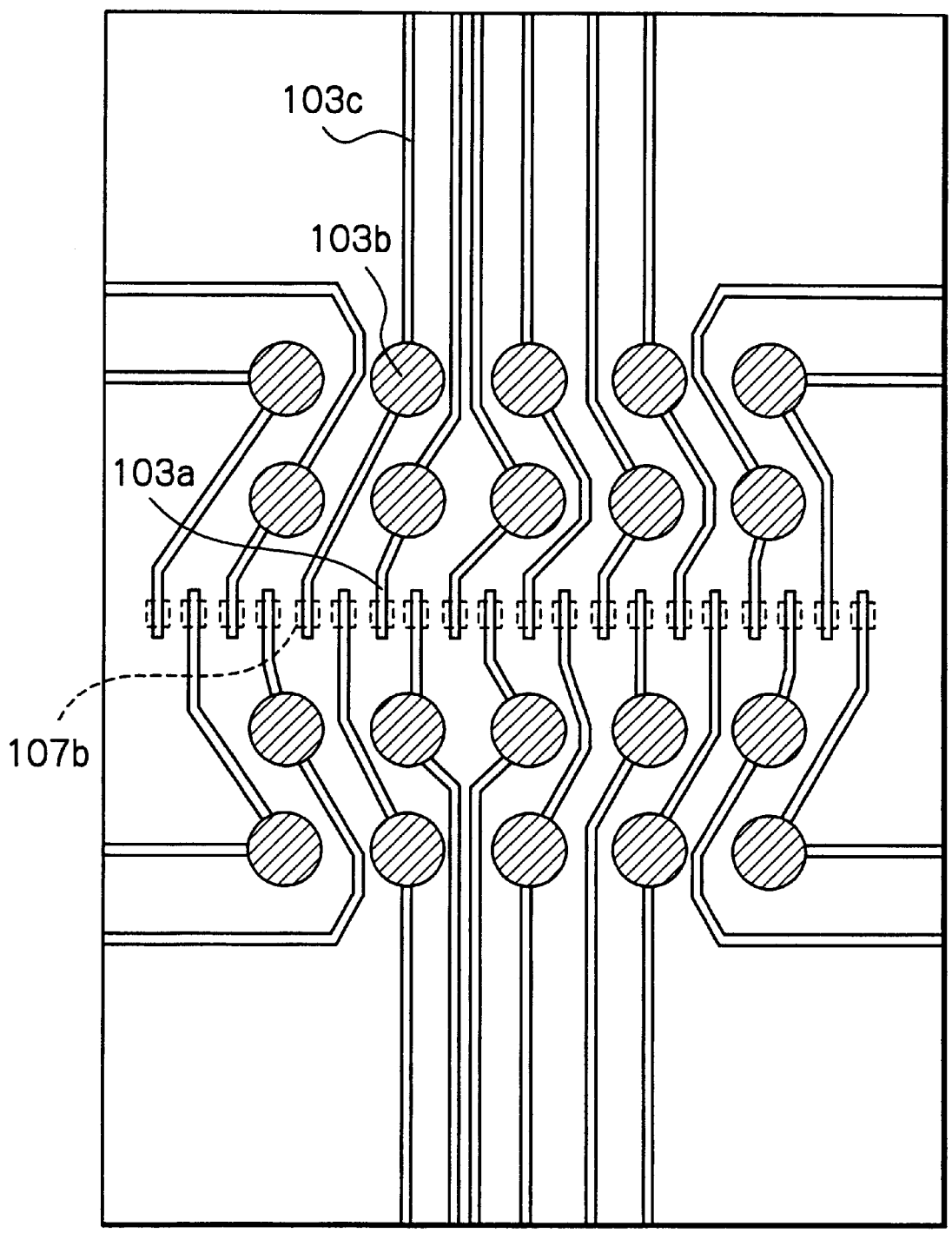
FIG. 4 is a plan view illustrating the Au plating layers of FIG. 1H.

Next, referring to FIG. 1H, an Au electroplating process is carried out by supplying a current to the pattern layer (103a, 103b, 103c) from the current supply area CA of FIG. 2 while the interposer substrate 101 is dipped into an Au plating solution. As a result, as illustrated in FIG. 4, an Au plating layer 107a is formed on the terminal 103b on the front surface of the interposer substrate 101, and an Au plating layer 107b is formed on the plug layer 106 on the back surface of the interposer substrate 101. Then, the current supply area CA of FIG. 2 is electrically separated from the package areas PA of FIG. 2.

Figure 1I:
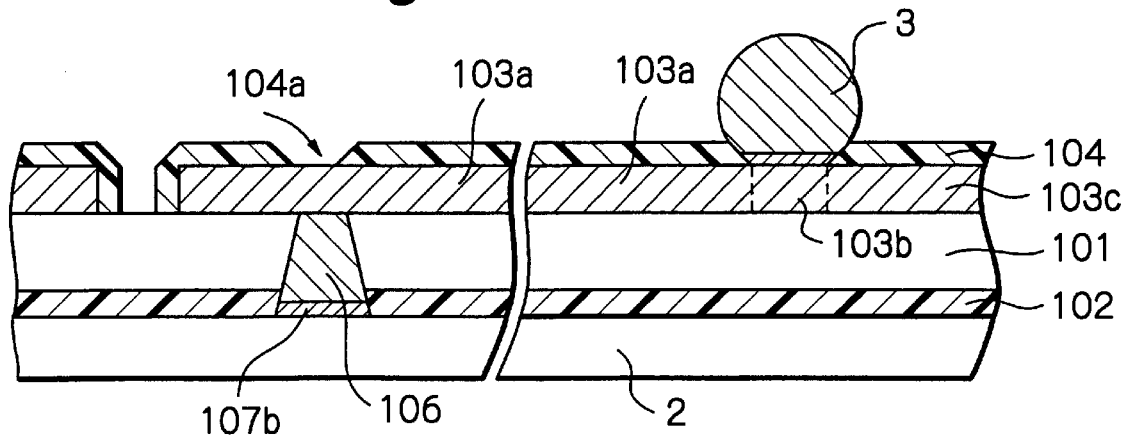

Finally, referring to FIG. 1I, a terminal of a flip-chip type semiconductor chip 2 is mounted on the back surface of the interposer substrate 101 by using an ultrasonic pushing tool. Then, the semiconductor chip 2 is molded by resin. Also, a solder ball 3 is provided on the front surface of the interposer substrate 101.

After that, a plurality of the package areas PA are separated by a cutting apparatus to obtain a plurality of BGA type semiconductor devices as illustrated in FIGS. 5A, 5B and 5C, where FIGS. 5B and 5C are side views of FIG. 5A.

In the BGA type semiconductor device obtained by the method as illustrated in FIGS. 1A through 1I, however, the plating layer 103c is left. Therefore, when the operation frequency of this BGA type semiconductor device is higher, the amount of signals reflected by the plating layer 103c is increased. Also, the parasitic capacitance of the plating layer 103c adversely affects signals from the semiconductor chip 2 to the solder bump 3 and vice versa.

A first embodiment of the method for manufacturing a BGA type semiconductor device will be explained next with reference to FIGS. 6A through 6J.

Initially, in the same way as in the prior art, an interposer substrate 11 made of polyimide as illustrated in FIG. 2 is prepared.

Figure 6A:
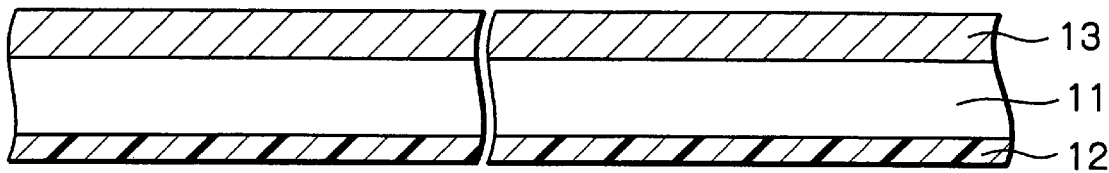
FIGS. 6A through 6J are cross-sectional views for explaining a first embodiment of the method for manufacturing a BGA type semiconductor device according to the present invention.

Next, referring to FIG. 6A, in the same way as in FIG. 1A, an adhesive layer 12 is coated on a back surface of the interposer substrate 11. Then, a copper foil layer 13 is formed on a front surface of the interposer substrate 11.

Figure 6B:
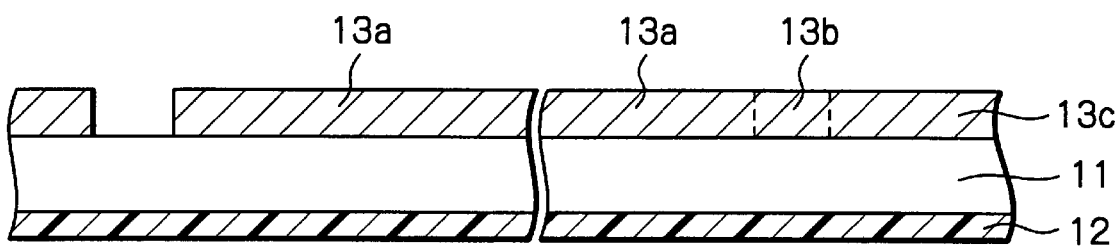
Figure 7:
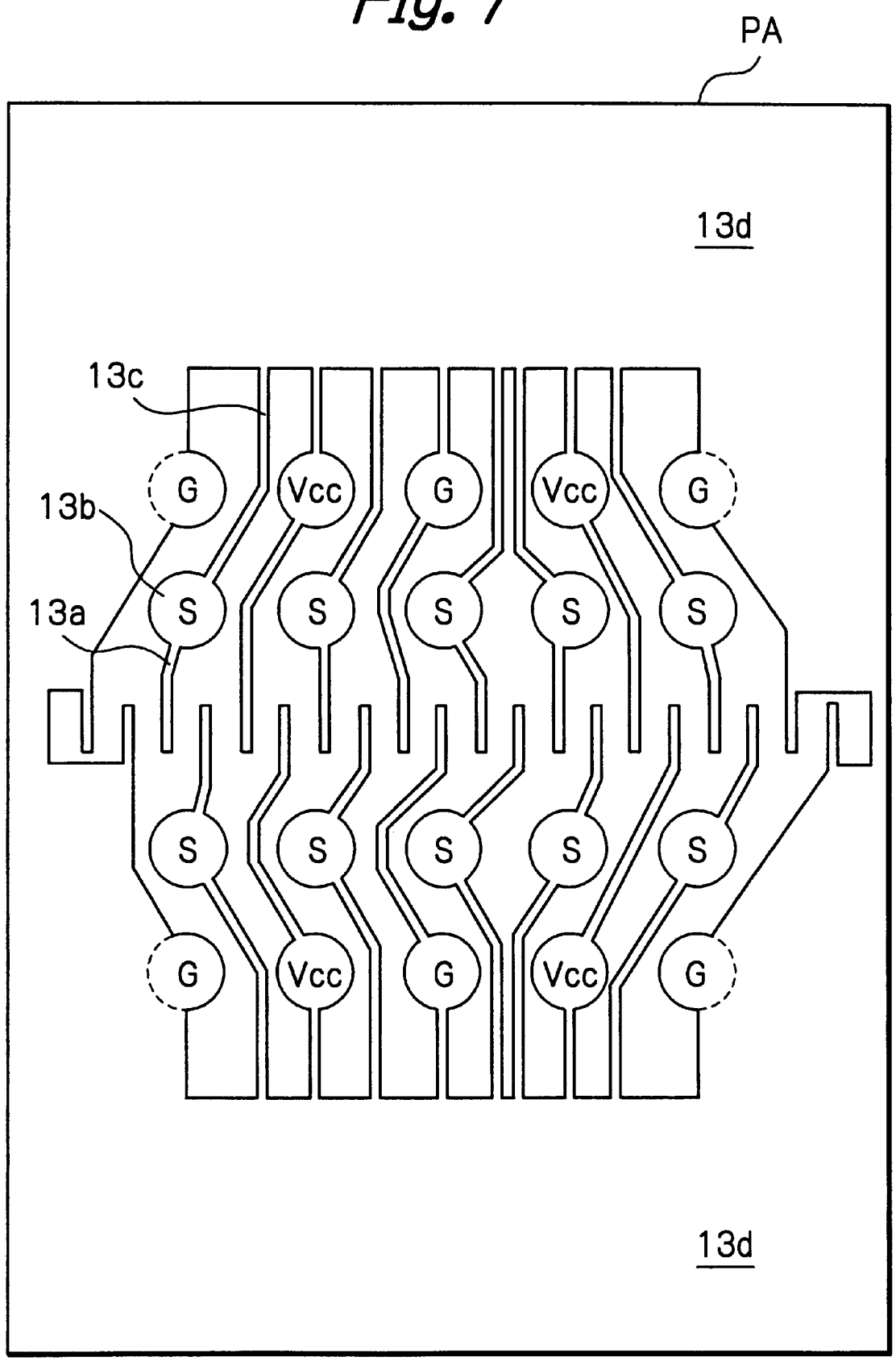
FIG. 7 is a plan view illustrating the pattern layer of FIG. 6B.

Next, referring to FIG. 6B, in a similar way to those of FIG. 1B, the copper foil layer 13 is patterned by a photolithography and etching process to form a pattern layer as illustrated in FIG. 7. Each pattern of the pattern layer is constructed by wiring layers 13a, terminals 13b for mounting solder balls (outer bumps), plating layers 13c, and a ground plate 13d. Note that the ground plate 13d is connected to the plating layers 13c. Also, the terminals 13b marked by "G" are ground terminals, the terminals 13b marked by "$V_{cc}$" are power supply terminals, and the terminals 13b marked by "S" are signal input/output terminals.

Figure 6C:
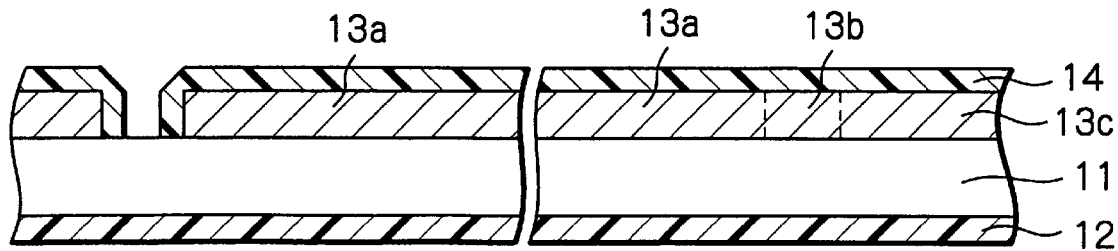

Next, referring to FIG. 6C, in the same way as in FIG. 1C, a solder resist layer 14 is coated on the entire front surface.

Figure 6D:
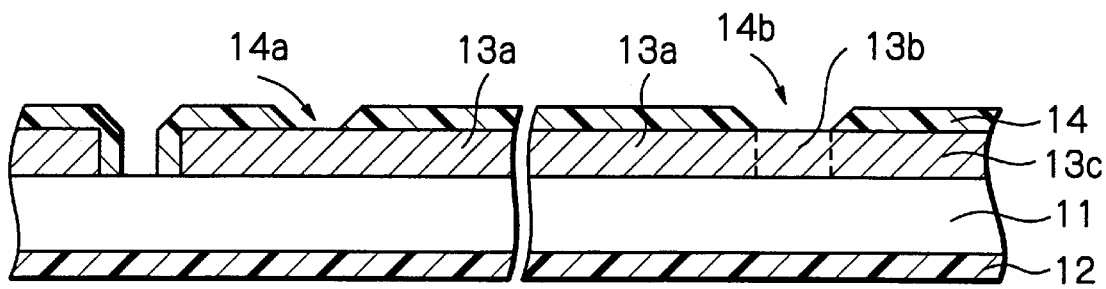

Next, referring to FIG. 6D, in the same way as in FIG. 1D, openings 14a and 14b are perforated in the solder resist layer 14. The opening 14a is used for forming an innerhole INH (see FIG. 6E), and the opening 14b exposes the terminal 13b.

Figure 6E:
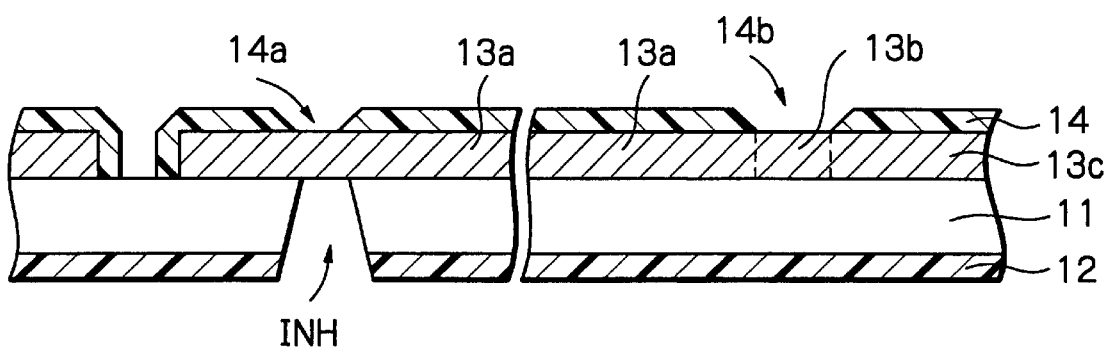

Next, referring to FIG. 6E, in the same way as in FIG. 1E, an innerhole INH is perforated in the adhesive layer 12 and the interposer substrate 11 by a laser trimming process or the like. Note that the innerhole INH does not penetrate the wiring layer 13a. Also, the innerhole INH corresponds to a terminal of a semiconductor chip which will be mounted on the back of the interposer substrate 11.

Figure 6F:
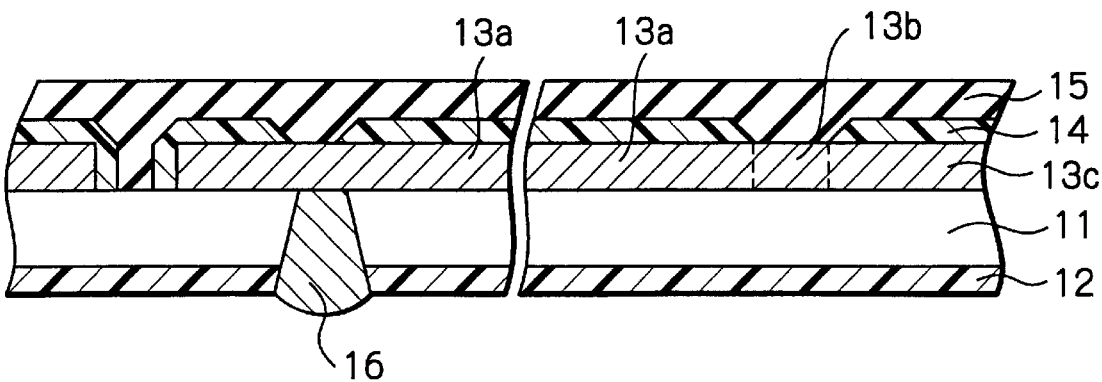

Next, referring to FIG. 6F, in the same way as in FIG. 1F, a plating mask layer 15 made of insulating material is coated on the entire front surface. Then, an electroplating process is carried out by supplying a current to the pattern layer (13a, 13b, 13c, 13d) from the current supply area CA of FIG. 2 while the interposer substrate 11 is dipped into a plating solution. As a result, a bump 16 is buried in the innerhole INH.

Figure 6G:
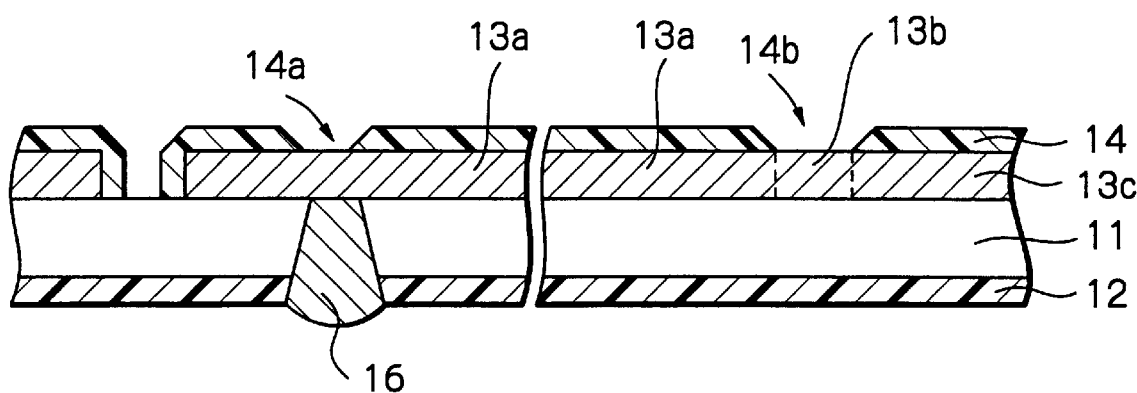

Next, referring to FIG. 6G, in the same way as in FIG. 1G, the plating mask layer 15 is removed.

Figure 6H:
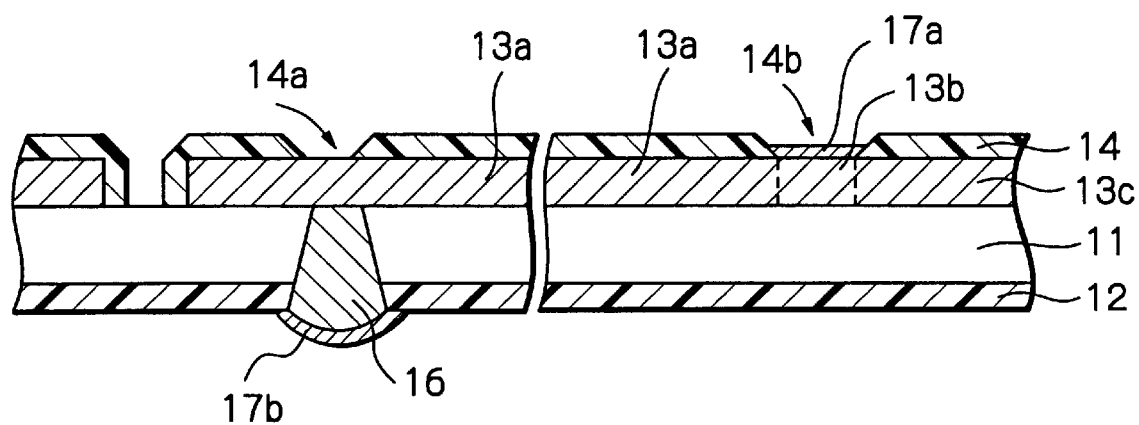
Figure 8:
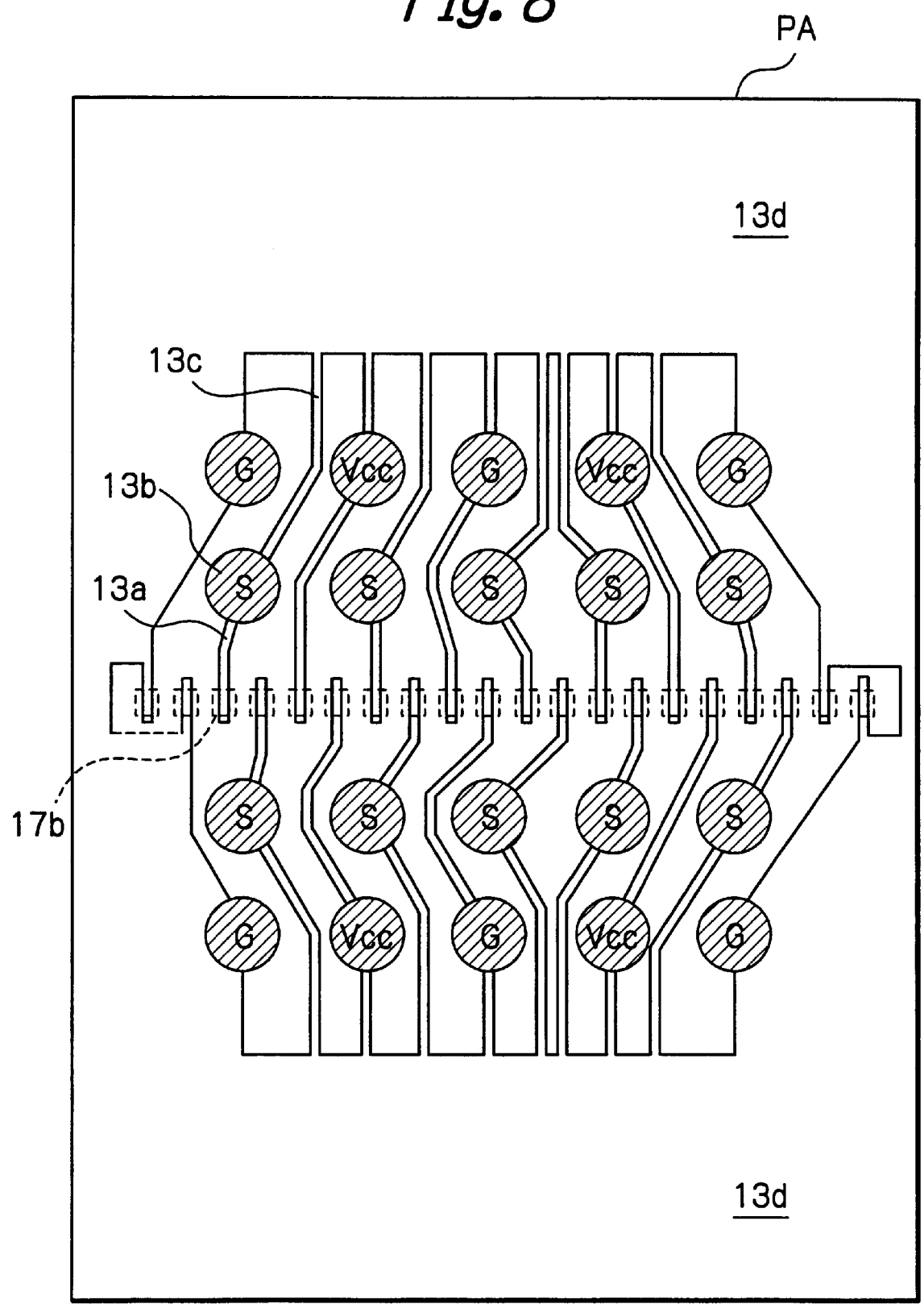
FIG. 8 is a plan view illustrating the Au plating layers of FIG. 6H.

Next, referring to FIG. 6H, in the same way as in FIG. 1H, an Au electroplating process is carried out by supplying a current to the pattern layer (13a, 13b, 13c, 13d) from the current supply area CA of FIG. 2 while the interposer substrate 11 is dipped into an Au plating solution. As a result, as illustrated in FIG. 8, an Au plating layer 17a is formed on the terminal 13b on the front surface of the interposer substrate 11, and an Au plating layer 17b is formed on the plug layer 16 on the back surface of the interposer substrate 11. Then, the current supply area CA of FIG. 2 is electrically separated from the package areas PA of FIG. 2.

Figure 6I:
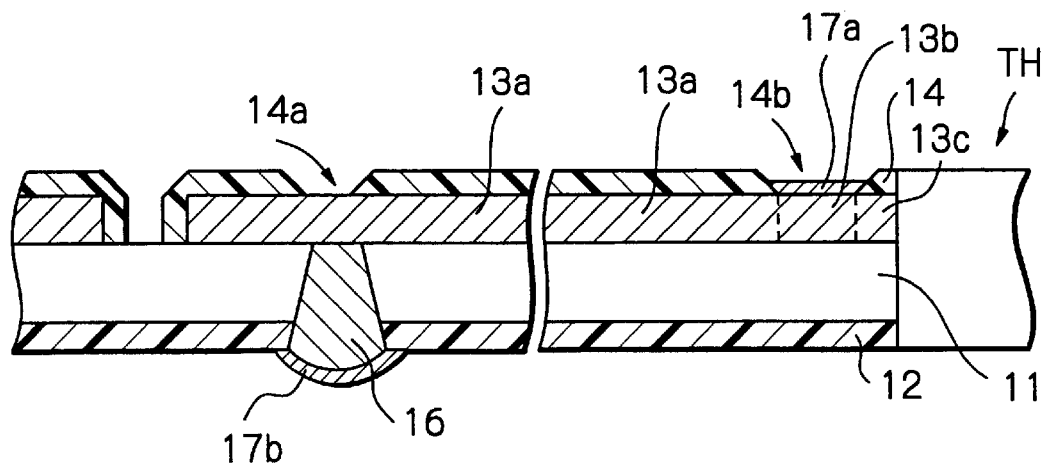
Figure 9:
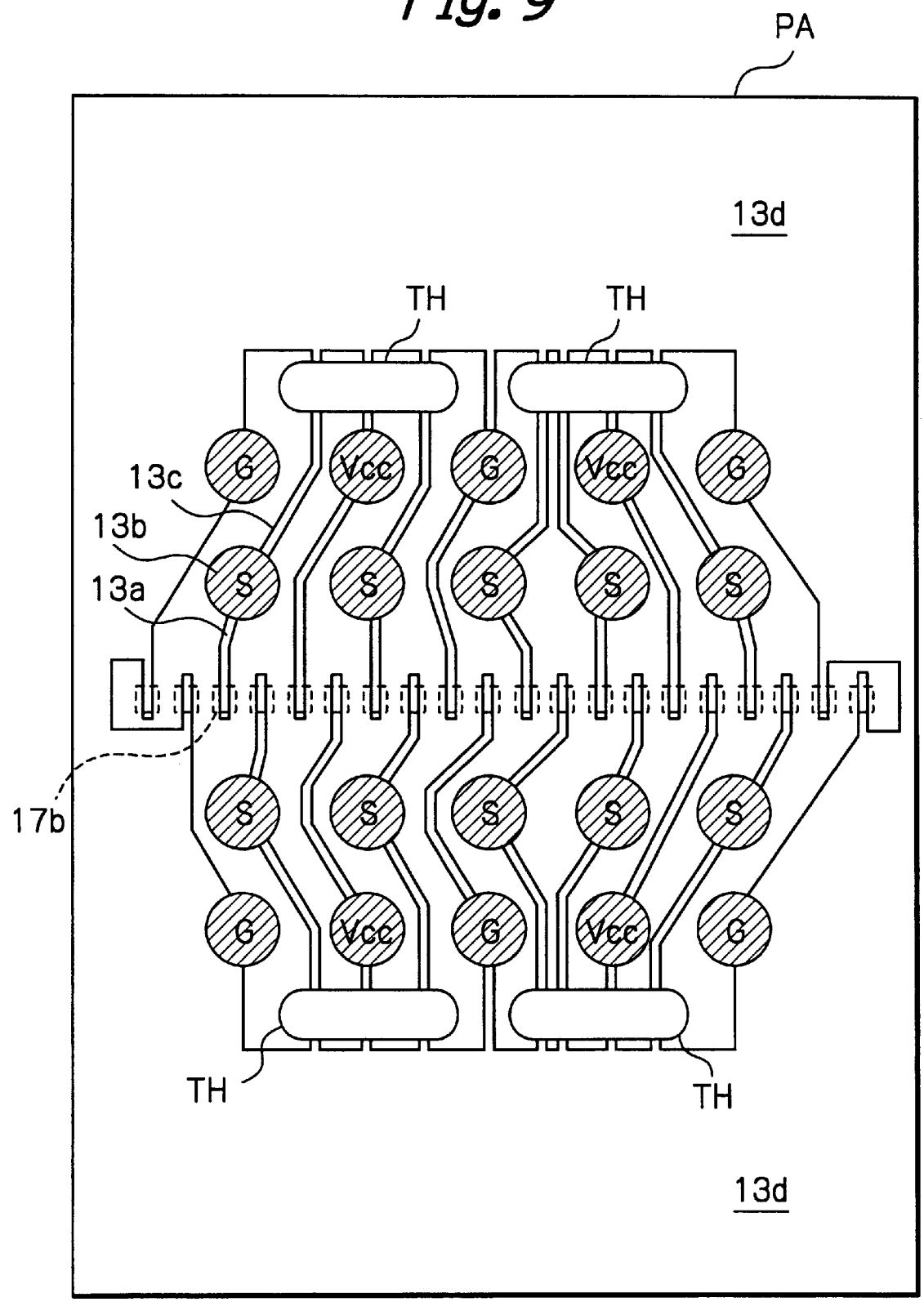
FIG. 9 is a plan view illustrating the Au plating layers of FIG. 6J.

Next, referring to FIG. 9 as well as FIG. 6I, throughholes TH are perforated in the interposer substrate 11, the adhesive layer 12 and the solder resist layer 14 by using metal molds. As a result, the plating layers 13c connected to the power supply terminals $V_{cc}$ and the signal input/output terminals S are terminated at the throughholes TH. In this case, these plating layers 13c serve as stubs. On the other hand, the plating layers 13c connected to the ground terminals G remains and is still connected to the plate ground layer 13d.

Figure 6J:
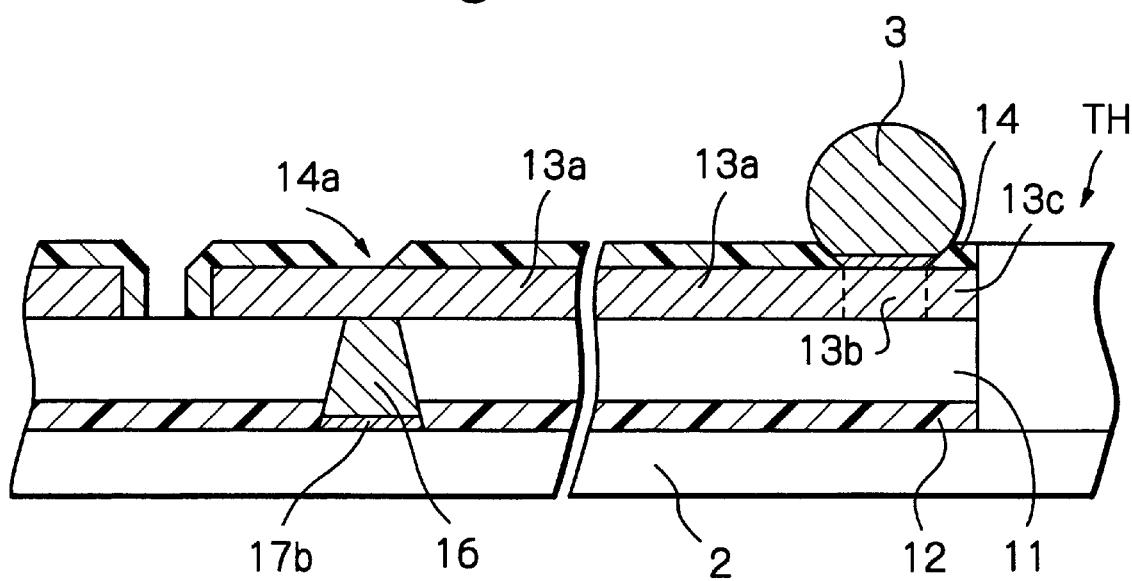
Figure 11:
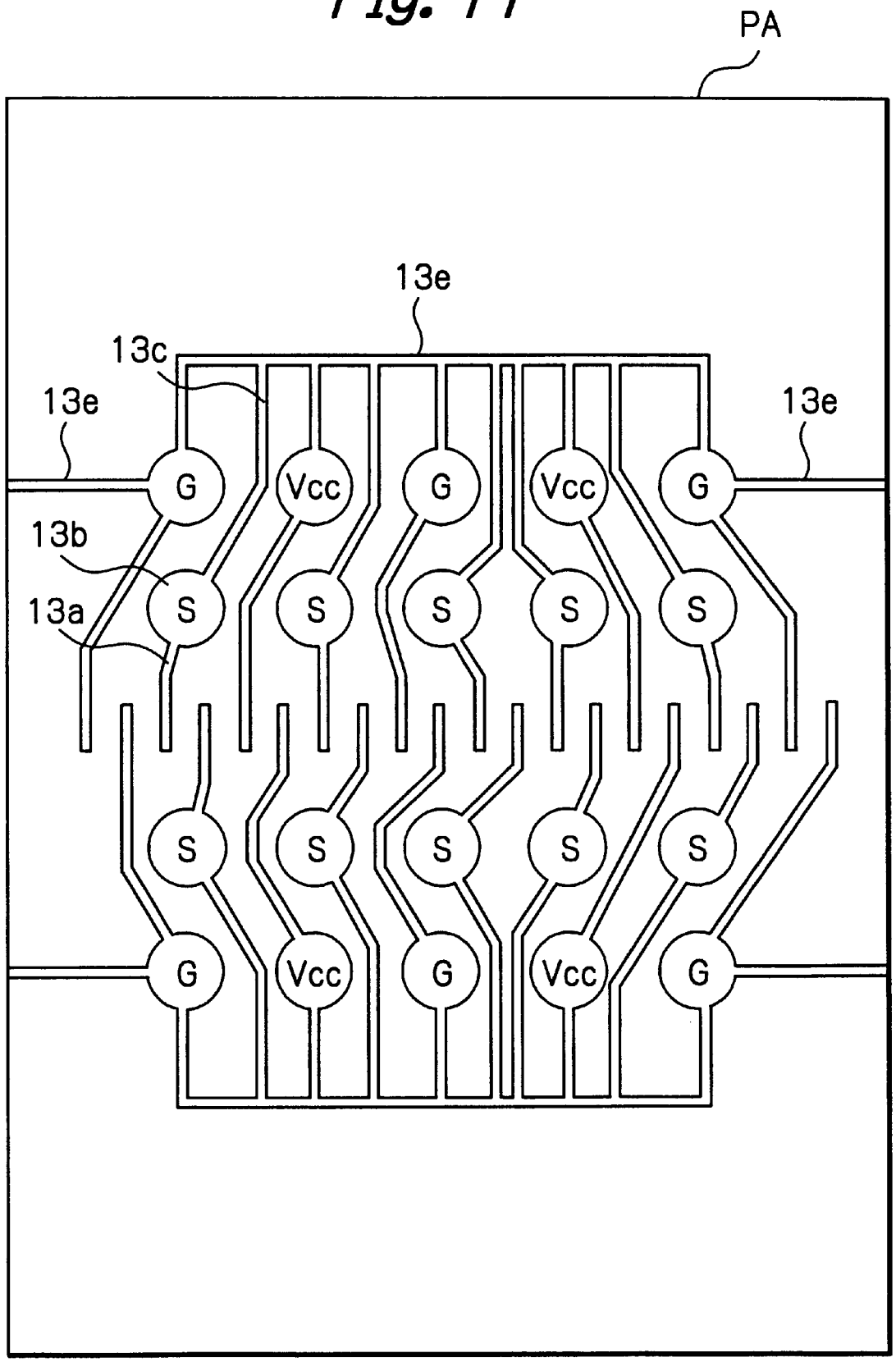
FIGS. 11, 12 and 13 are plan views illustrating modifications of FIGS. 7, 8 and 9, respectively.

Finally, referring to FIG. 6J, in the same way as in FIG. 11, a terminal of a flip-chip type semiconductor chip 2 is mounted on the back surface of the interposer substrate 11 by using an ultrasonic pushing tool. Then, the semiconductor chip 2 is molded by resin. Also, a solder ball 3 is provided on the front surface of the interposer substrate 11.

Figure 10A:
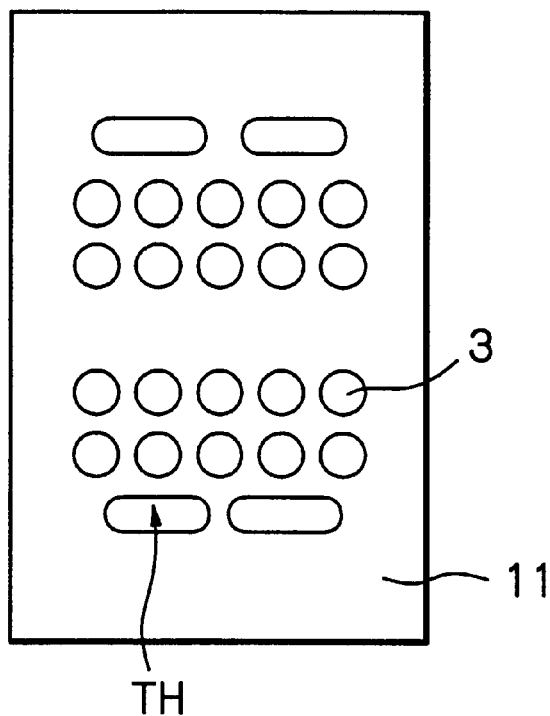
FIG. 10A is a plan view illustrating the BGA type semiconductor device obtained by the method as illustrated in FIGS. 6A through 6J.
Figure 10B:
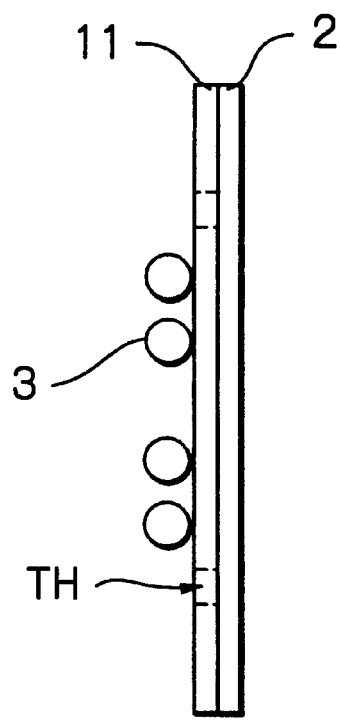
FIGS. 10B and 10C are side views of the device of FIG. 10A.
Figure 10C:
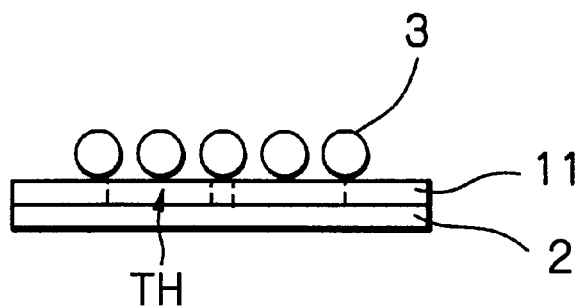

After that, a plurality of the package areas PA are separated by a cutting apparatus to obtain a plurality of BGA type semiconductor devices as illustrated in FIGS. 10A, 10B and 10C, where FIGS. 10B and 10C are side views of FIG. 10A.

In the BGA type semiconductor device obtained by the method as illustrated in FIGS. 6A through 6J, the plating layers 13c connected to the power supply terminal $V_{cc}$ and the signal input/output terminals S are terminated at the throughholes TH. Therefore, even when the operation frequency of this BGA type semiconductor device is higher, the amount of signals reflected by the plating layers 13c is decreased. Also, since the parasitic capacitance of the plating layers 13c is decreased, signals from the semiconductor chip 2 to the solder bump 3 and vice versa are hardly affected thereby.

Also, in the first embodiment, since the ground plate 13d covers a large area of the package, the noise at the signal input/output terminals S can be remarkably suppressed.

Further, in the first embodiment, if the terminals 13b are signal input/output terminals S, a length L of each of the pattern layers 13 between the bump 16 and the throughhole TH should be as small as possible to decrease the capacitance, thus enabling a high speed operation. Also, a length L1 of each of the remaining plating layers 13c connected to the signal input/output terminals S should be as small as possible to decrease the amount of reflected signals. Further, the length L of each of the pattern layers 13 connected to the signal input/output terminals S are equalized to homogenize the capacitance thereof, which is helpful in a high speed operation.

Figure 12:
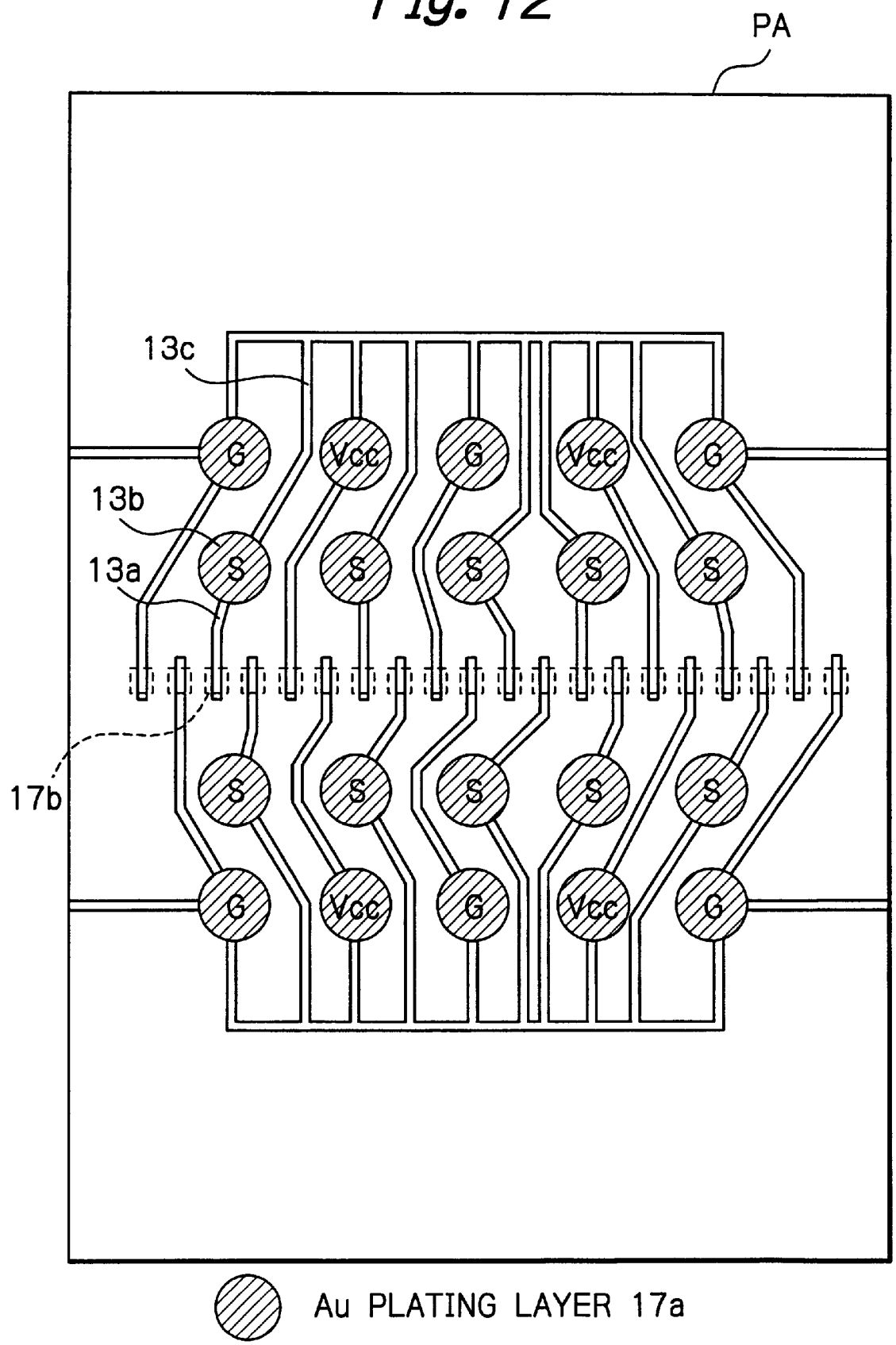
Figure 13:
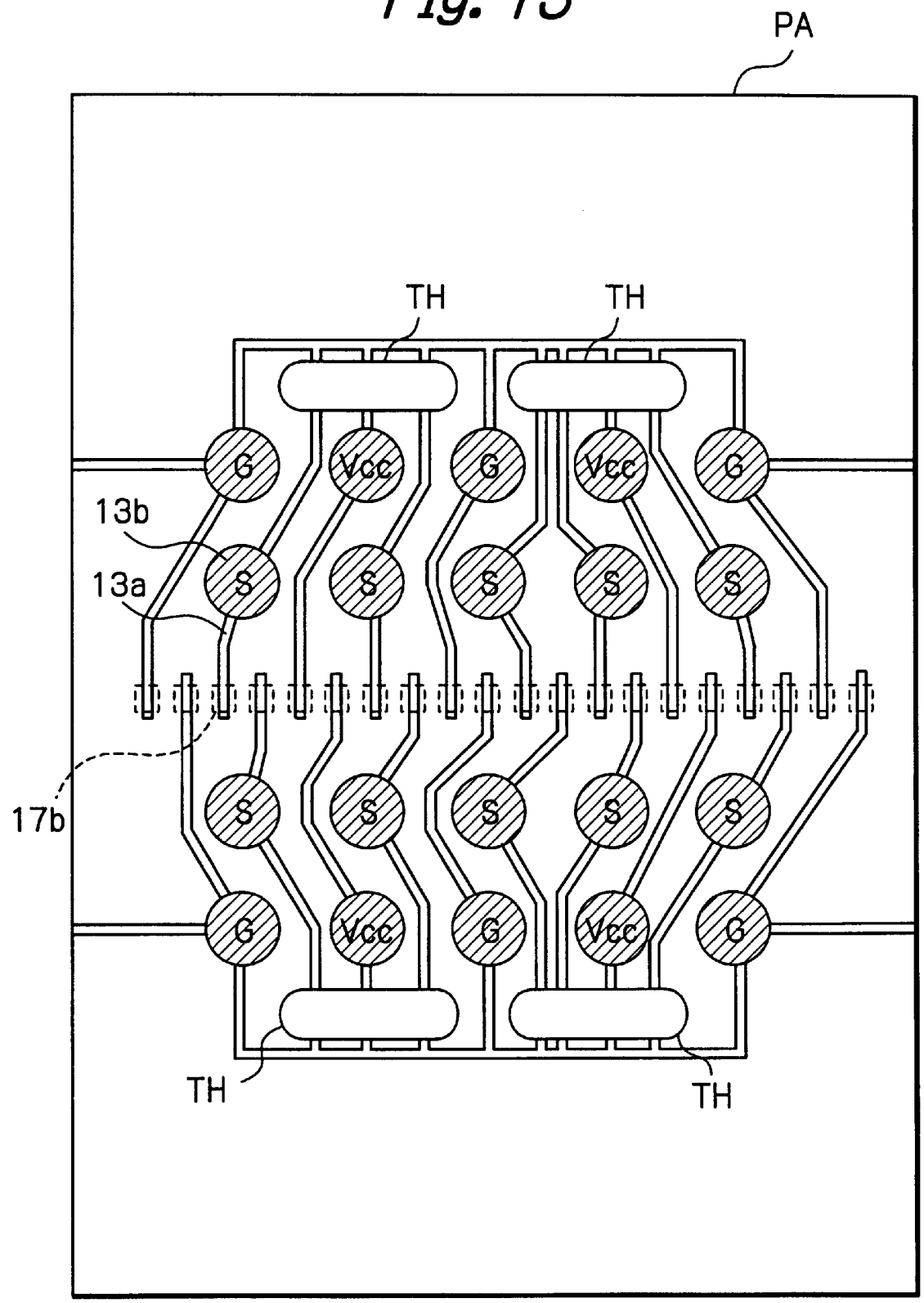
Figure 13:
Figure 14:
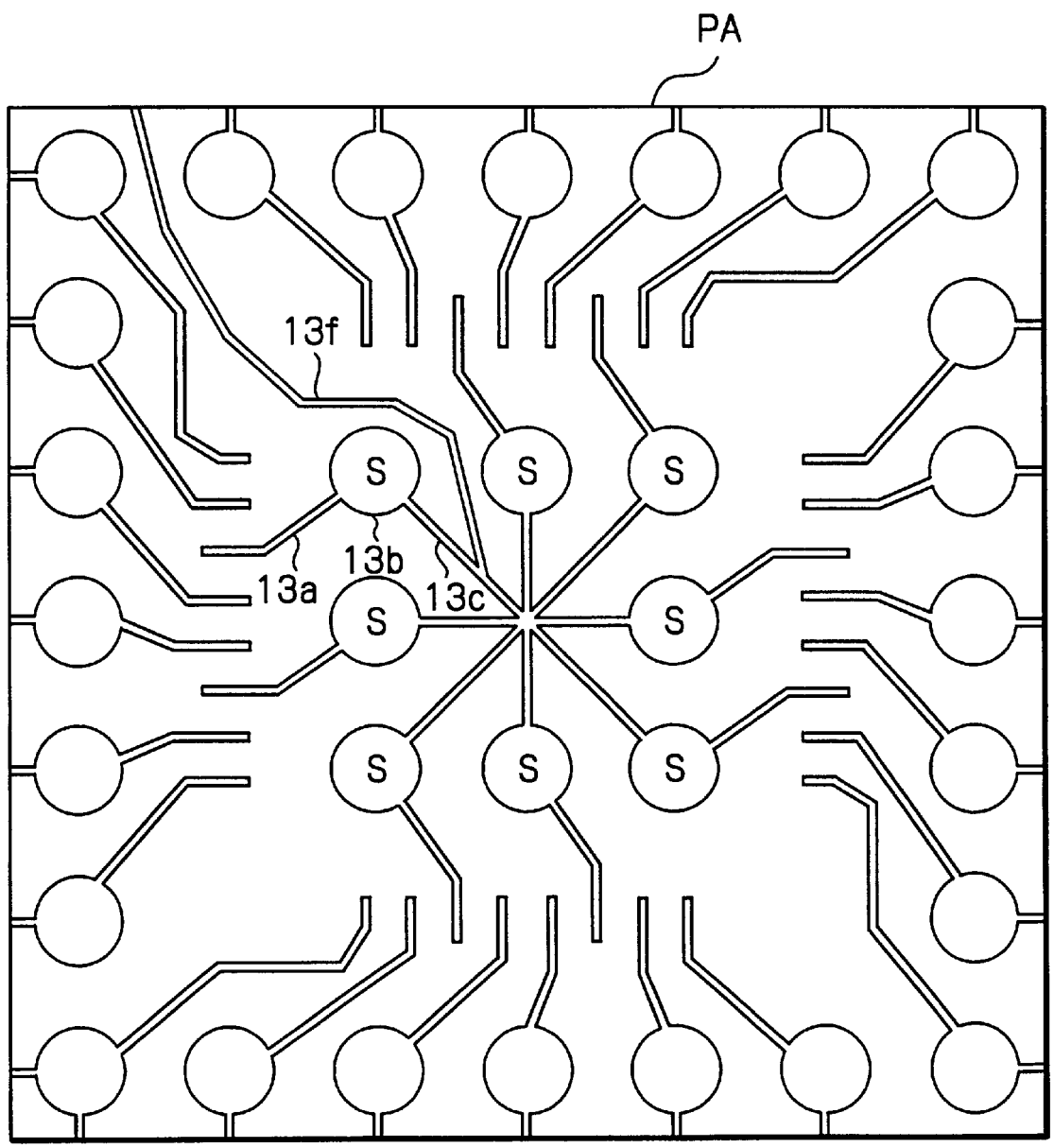
FIGS. 14, 15 and 16 are plan views illustrating other modifications of FIGS. 7, 8 and 9, respectively.
Figure 15:
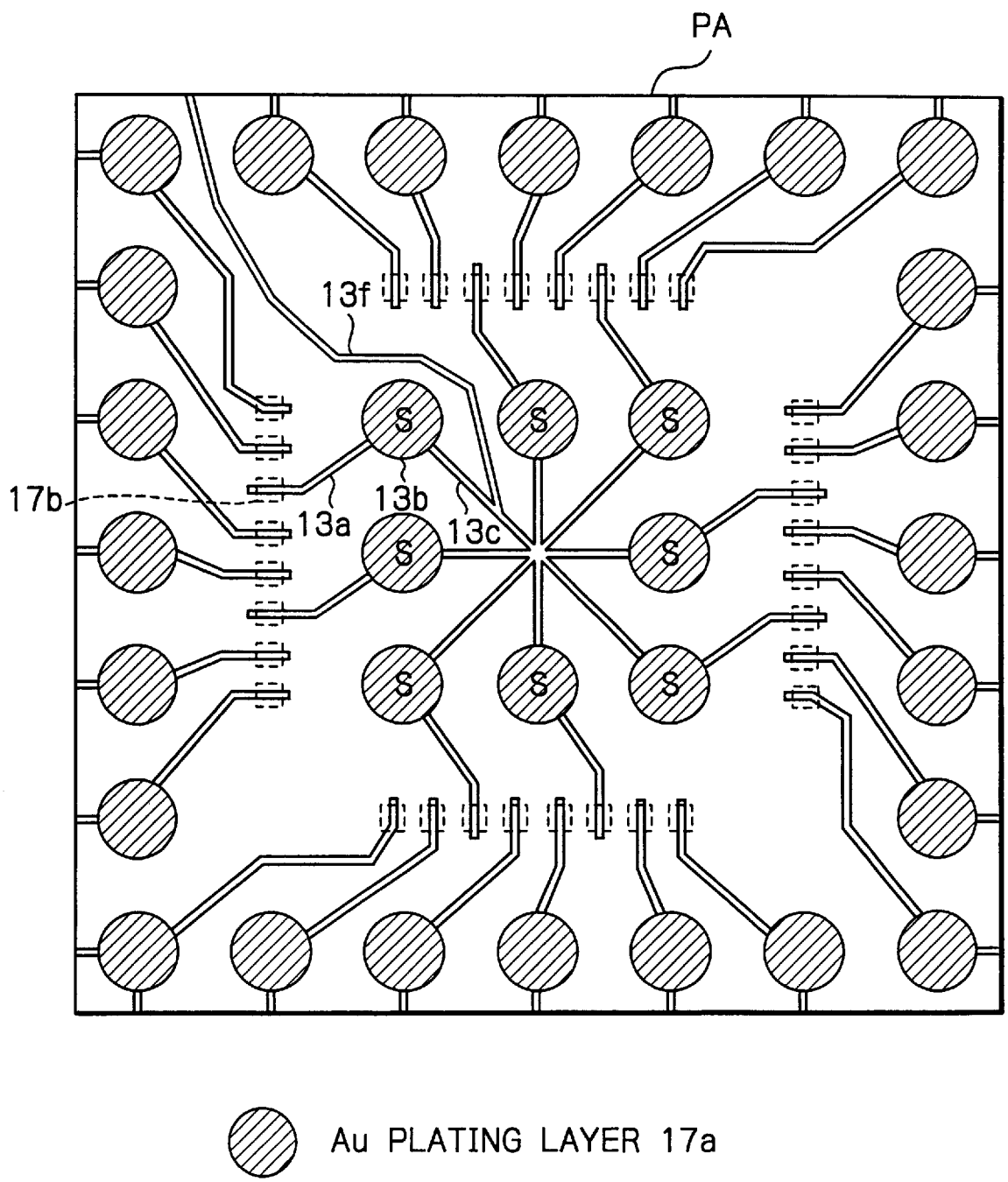
Figure 16:
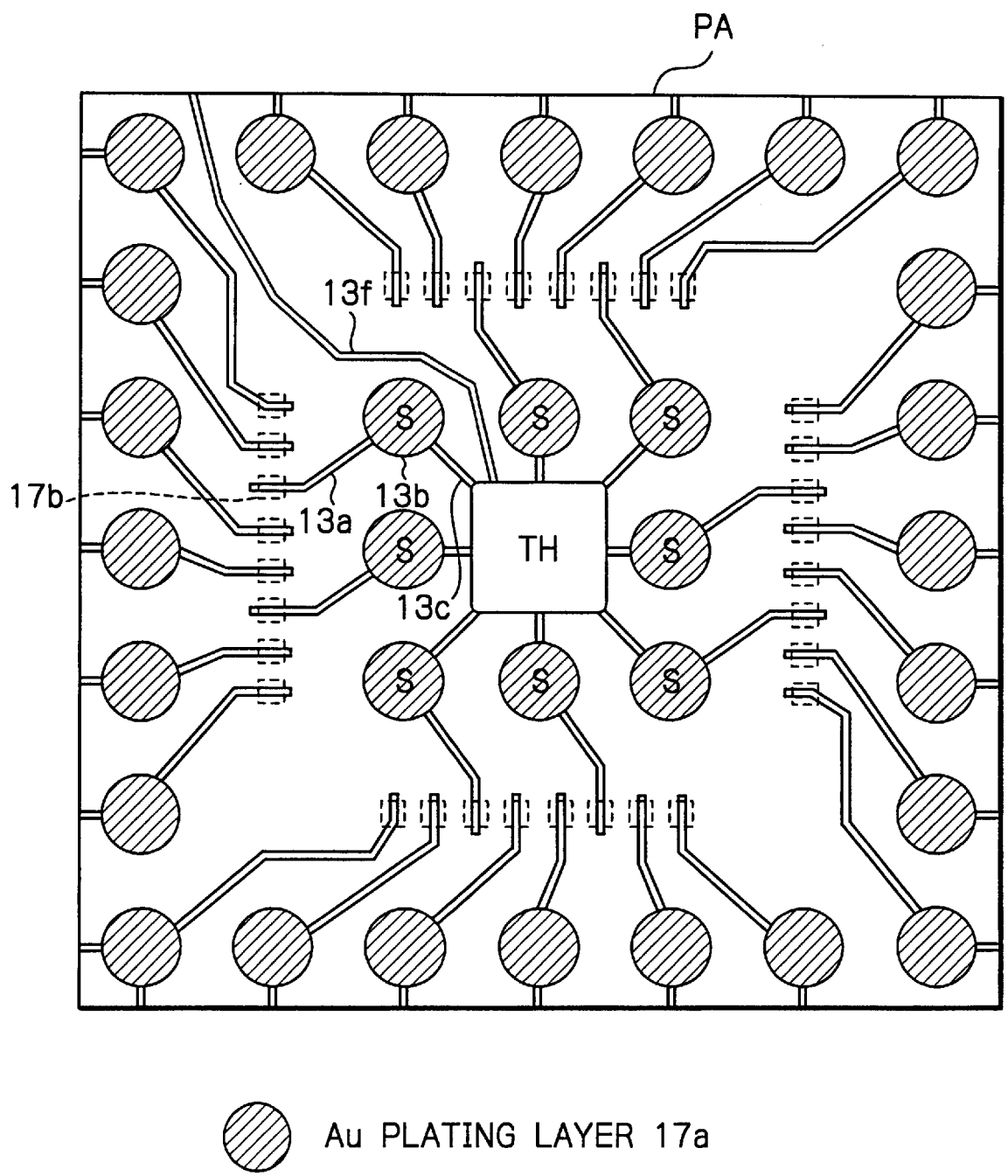

The first embodiment can be modified as illustrated in FIGS. 11, 12 and 13, which correspond to FIGS. 7, 8 and 9, respectively. That is, the ground plate 13d of FIGS. 7, 8 and 9 is replaced by wiring layers 13e. Even in this modification, the same effect except for the noise characteristics by the ground plate 13d can be expected. The first embodiment can be also modified as illustrated in FIGS. 14, 15 and 16, which correspond to FIGS. 7, 8 and 9, respectively. That is, the ground plate 13d of FIGS. 7, 8 and 9 is replaced by plating layers 13f. The plating layers 13f are used in the Au electroplating process, and the plating layers 13f as well as the plating layers 13c are terminated by forming a throughhole TH. In FIGS. 14, 15 and 16, note that each of the terminals 13b provided in the periphery of the package PA can be any of a ground terminal G, a power supply terminal $V_{cc}$ and a signal input/output terminal S, while each of the terminals 13b provided at the center of the package PA can be a signal input/output terminal S or a power supply terminal G. Even in this modification, the same effect except for the noise characteristics by the ground plate 13d can be expected.

A second embodiment of the method for manufacturing a BGA type semiconductor device will be explained next with reference to FIGS. 17A through 17J.

Initially, in the same way as in the prior art, an interposer substrate 21 made of polyimide as illustrated in FIG. 2 is prepared.

Figure 17A:
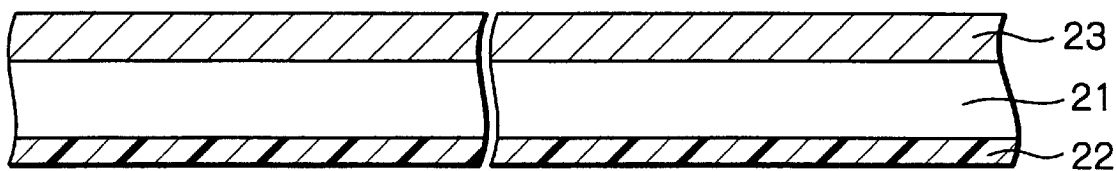
FIGS. 17A through 17J are cross-sectional views for explaining a second embodiment of the method for manufacturing a BGA type semiconductor device according to the present invention.

Next, referring to FIG. 17A, in the same way as in FIG. 1A, an adhesive layer 22 is coated on a back surface of the interposer substrate 21. Then, a copper foil layer 23 is formed on a front surface of the interposer substrate 21.

Figure 17B:
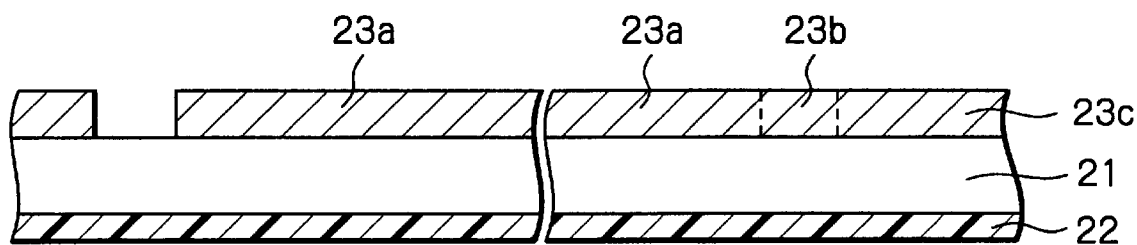
Figure 18:
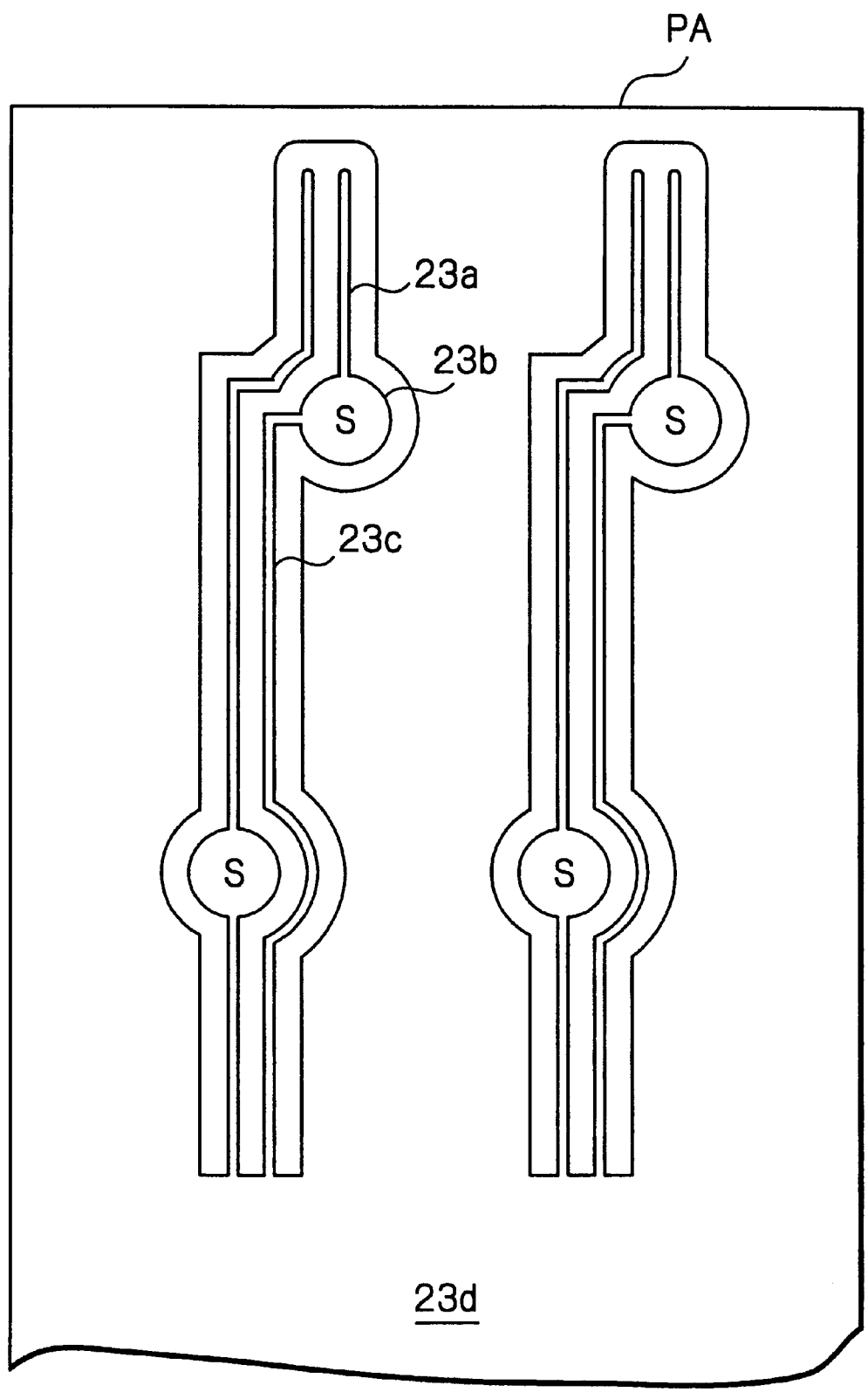
FIG. 18 is a plan view illustrating the pattern layer of FIG. 17B.

Next, referring to FIG. 17B, in a similar way to those of FIG. 1B, the copper foil layer 23 is patterned by a photolithography and etching process to form a pattern layer as illustrated in FIG. 18. Each pattern of the pattern layer is constructed by wiring layers 23a, terminals 23b for mounting solder balls (outer bumps), plating layers 23c, and a ground plate 23d. Note that the ground plate 23d is connected to the plating layers 23c. Also, the terminals 23b marked by "S" are signal input/output terminals. Further, since the ground plate 23d surrounds the pattern layer (23a, 23b, 23c) so that the pattern layer is shielded by the ground plate 23d, the inductance of the package can be decreased.

Figure 17C:
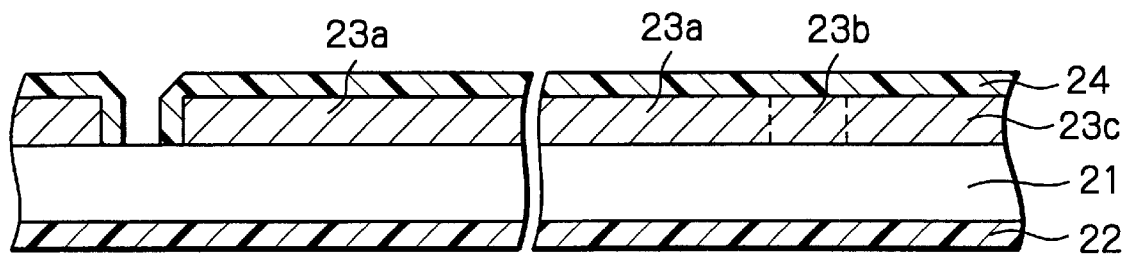

Next, referring to FIG. 17C, in the same way as in FIG. 1C, a solder resist layer 24 is coated on the entire front surface.

Figure 17D:
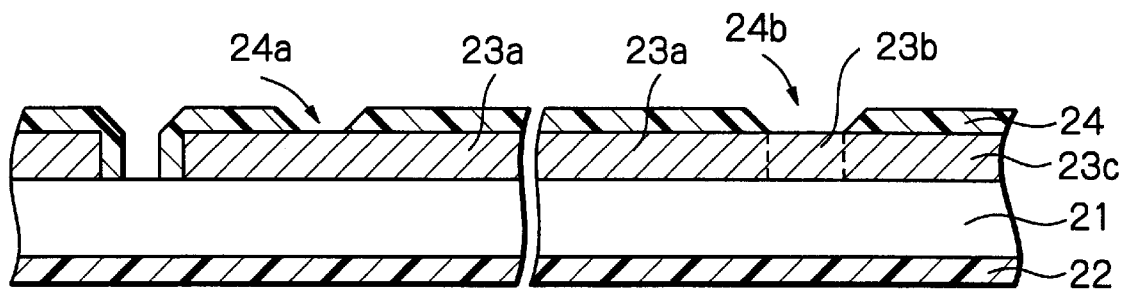

Next, referring to FIG. 17D, in the same way as in FIG. 1D, openings 24a and 24b are perforated in the solder resist layer 24. The opening 24a is used for forming an innerhole INH (see FIG. 17E), and the opening 24b exposes the terminal 23b.

Figure 17E:
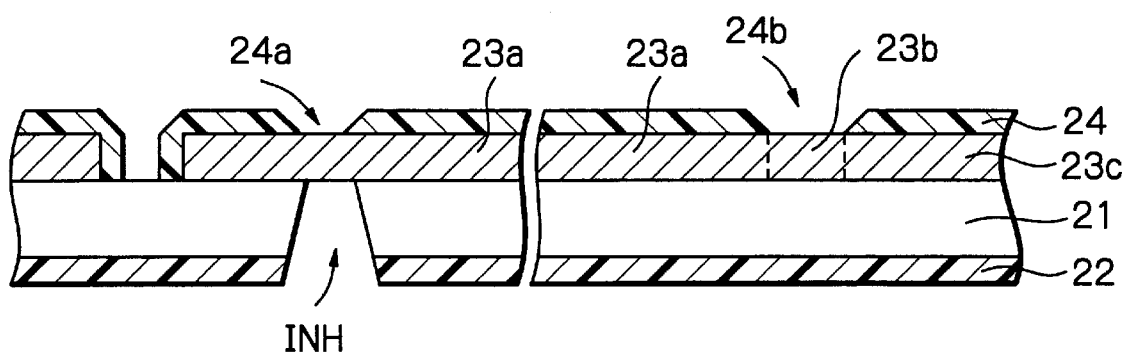

Next, referring to FIG. 17E, in the same way as in FIG. 1E, an innerhole INH is perforated in the adhesive layer 22 and the interposer substrate 21 by a laser trimming process or the like. Note that the innerhole INH does not penetrate the wiring layer 23a. Also, the innerhole INH corresponds to a terminal of a semiconductor chip which will be mounted on the back of the interposer substrate 21.

Figure 17F:
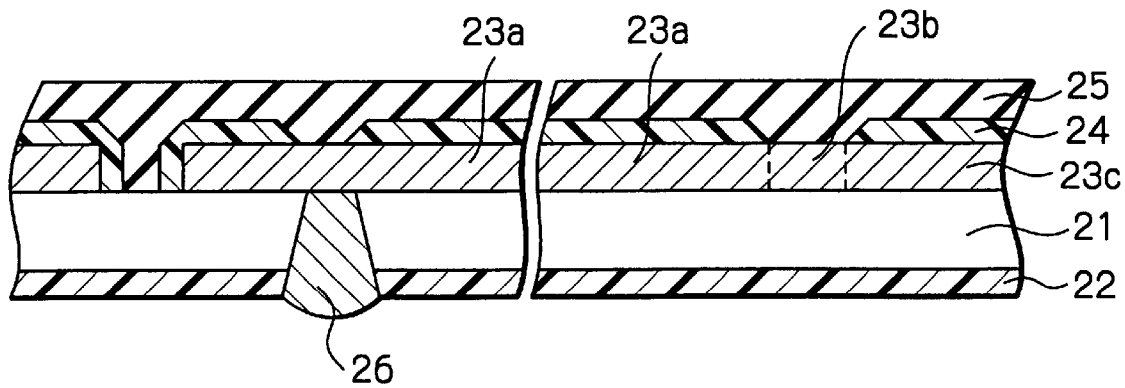

Next, referring to FIG. 17F, in the same way as in FIG. 1F, a plating mask layer 25 made of insulating material is coated on the entire front surface. Then, an electroplating process is carried out by supplying a current to the pattern layer (23a, 23b, 23c, 23d) from the current supply area CA of FIG. 2 while the interposer substrate 21 is dipped into a plating solution. As a result, a bump 26 is buried in the innerhole INH.

Figure 17G:
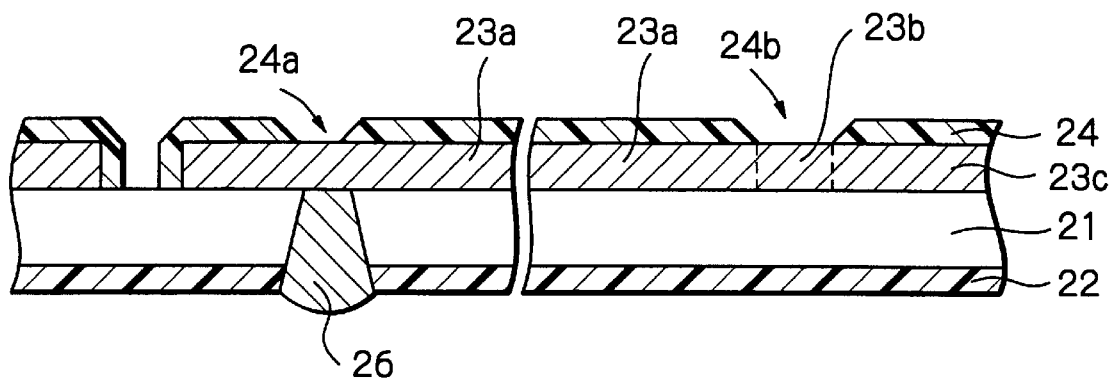

Next, referring to FIG. 17G, in the same way as in FIG. 1G, the plating mask layer 25 is removed.

Figure 17H:
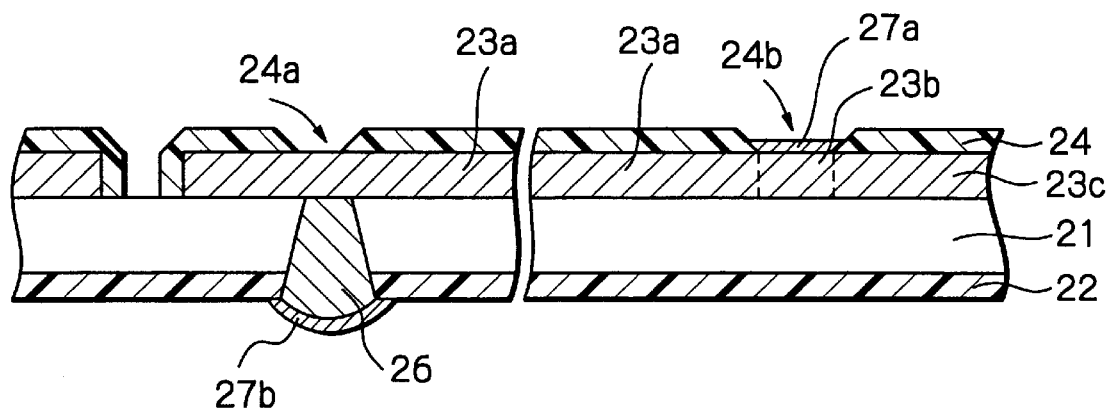
Figure 19:
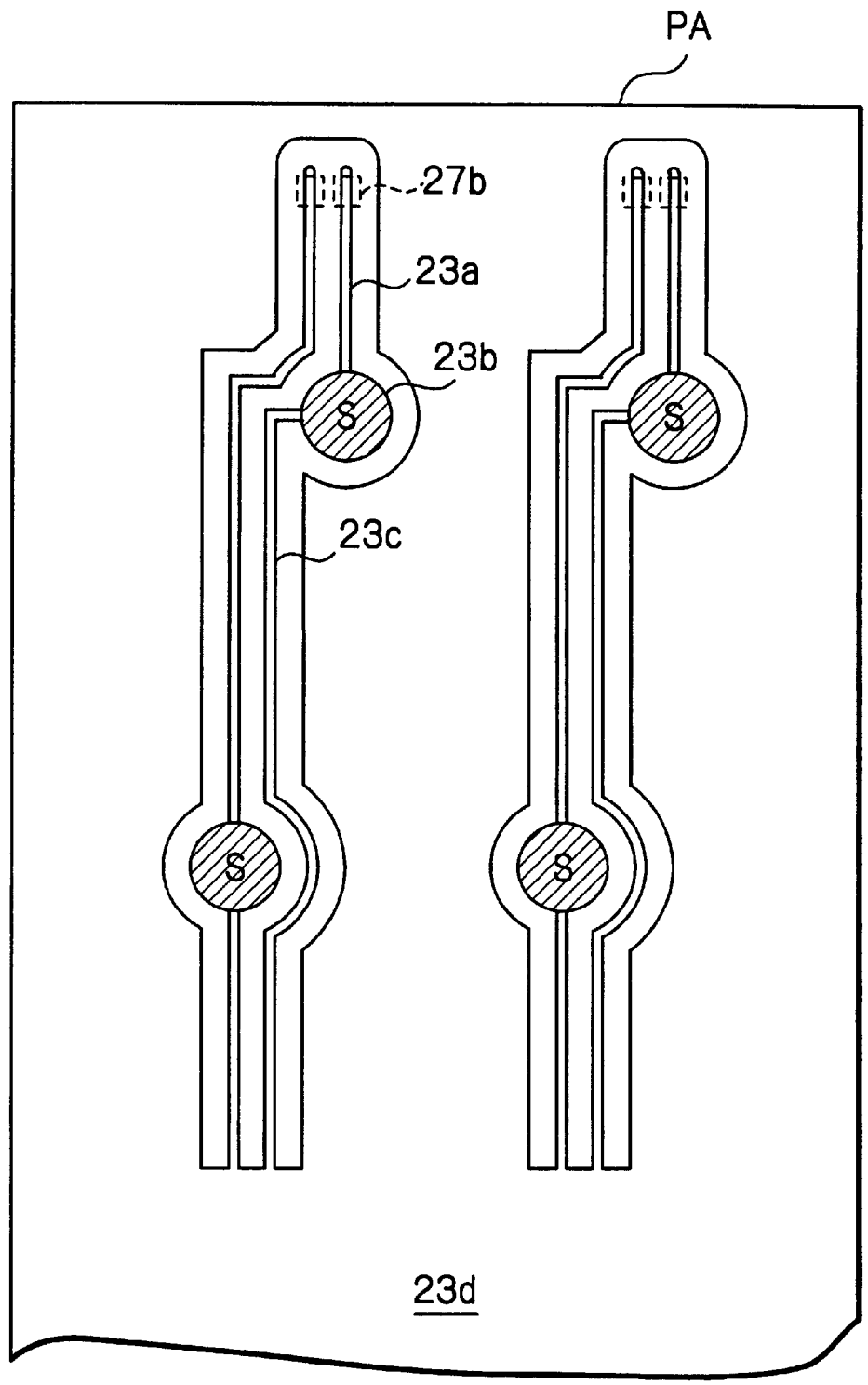
FIG. 19 is a plan view illustrating the Au plating layers of FIG. 17H.
Figure 19:

Next, referring to FIG. 17H, in the same way as in FIG. 1H, an Au electroplating process is carried out by supplying a current to the pattern layer (23a, 23b, 23c, 23d) from the current supply area CA of FIG. 2 while the interposer substrate 21 is dipped into an Au plating solution. As a result, as illustrated in FIG. 19, an Au plating layer 27a is formed on the terminal 23b on the front surface of the interposer substrate 21, and an Au plating layer 27b is formed on the plug layer 26 on the back surface of the interposer substrate 21. Then, the current supply area CA of FIG. 2 is electrically separated from the package areas PA of FIG. 2.

Figure 17I:
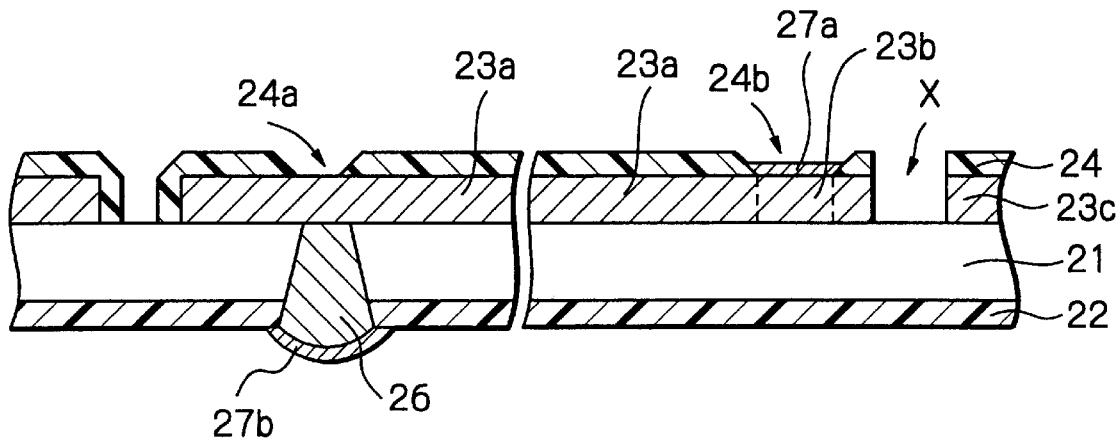
Figure 20:
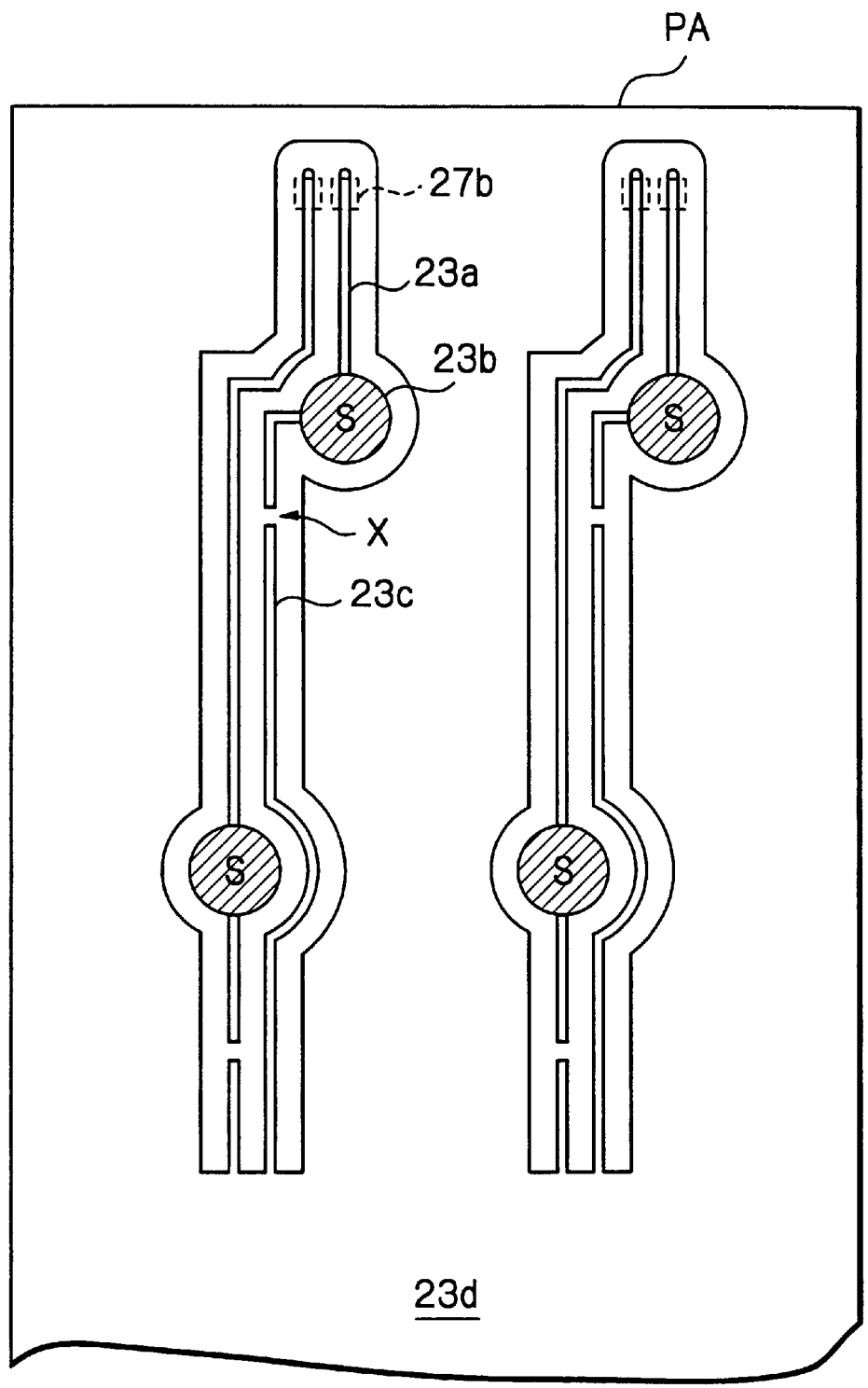
FIG. 20 is a plan view illustrating the Au plating layer of FIG. 17J.
Figure 20:

Next, referring to FIG. 20 as well as FIG. 17I, a part of the plating layer 27c on the side of the terminals S is removed by a laser trimming process or a photolithography and etching process. Note that a part of the solder resist layer 24 is also removed. As a result, the plating layer 23c connected to the signal input/output terminal S is terminated at a location indicated by X. In this case, the plating layer 23c serves as a stub.

Figure 17J:
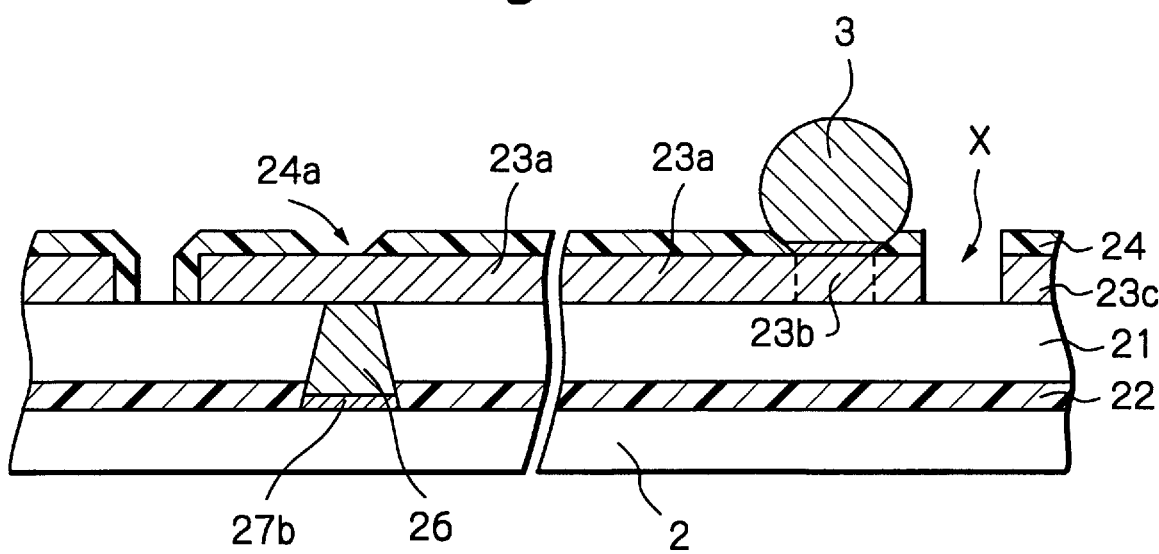

Finally, referring to FIG. 17J, in the same way as in FIG. 1I, a terminal of a flip-chip type semiconductor chip 2 is mounted on the back surface of the interposer substrate 21 by using an ultrasonic pushing tool. Then, the semiconductor chip 2 is molded by resin. Also, a solder ball 3 is provided on the front surface of the interposer substrate 21.

After that, a plurality of the package areas PA are separated by a cutting apparatus to obtain a plurality of BGA type semiconductor devices.

In the BGA type semiconductor device obtained by the method as illustrated in FIGS. 17A through 17J, the plating layers 23c connected to the signal input/output terminal S is terminated at the location X. Therefore, even when the operation frequency of this BGA type semiconductor device is higher, the amount of signals reflected by the plating layers 23c is decreased. Also, since the parasitic capacitance of the plating layers 23c is decreased, signals from the semiconductor chip 2 to the solder bump 3 and vice versa are hardly affected thereby.

Also, in the second embodiment, since the ground plate 23d covers a large area of the package, the noise at the signal input/output terminals S can be remarkably suppressed.

Further, in the second embodiment, a length L of the pattern layers 23 between the bump 26 and the location X should be as small as possible to decrease the capacitance, thus enabling a high speed operation. Also, a length L1 of each of the remaining plating layers 23c should be as small as possible to decrease the amount of reflected signals.

Figure 21:
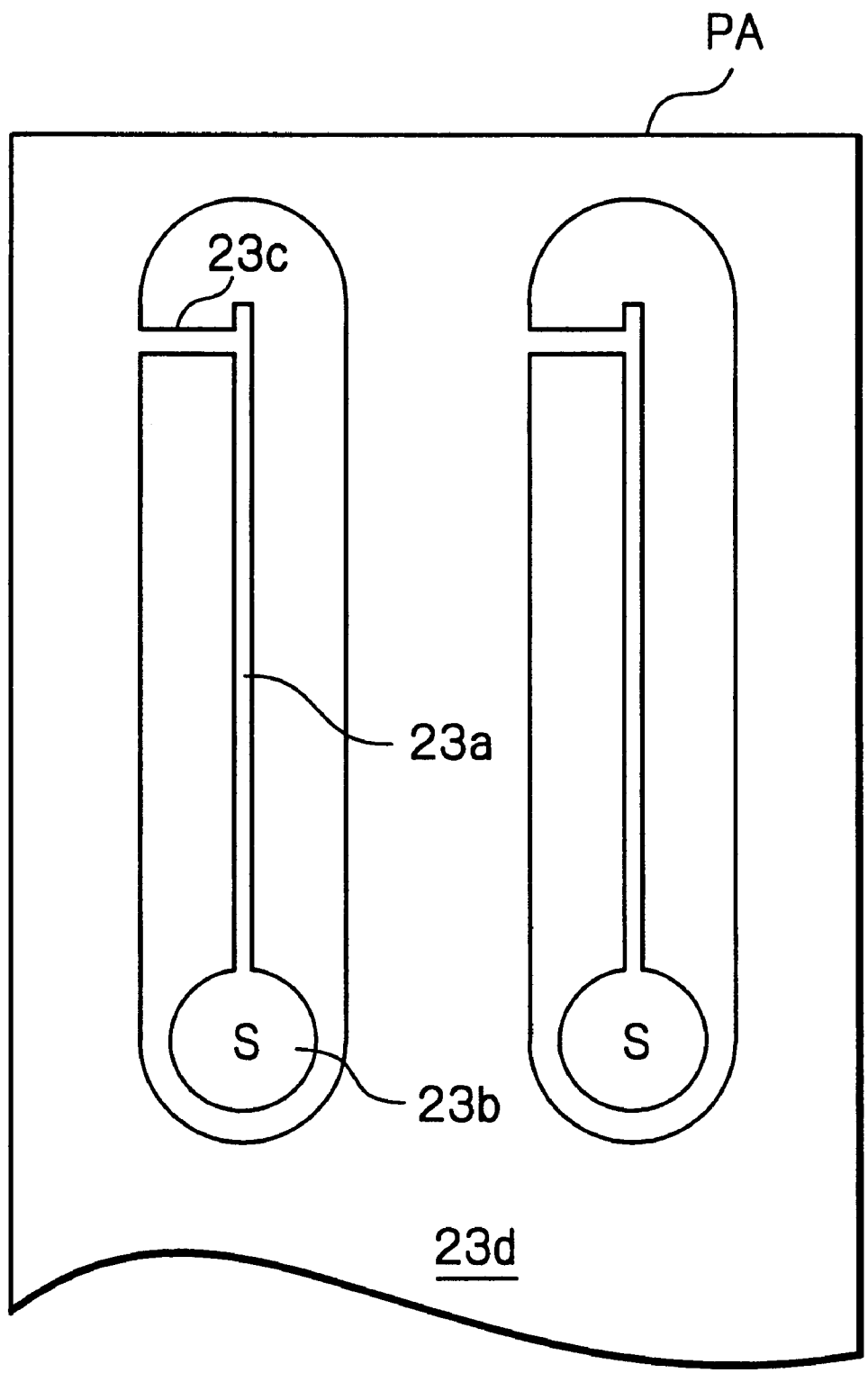
FIGS. 21, 22 and 23 are plan views illustrating modifications of FIGS. 18, 19 and 20, respectively.
Figure 22:
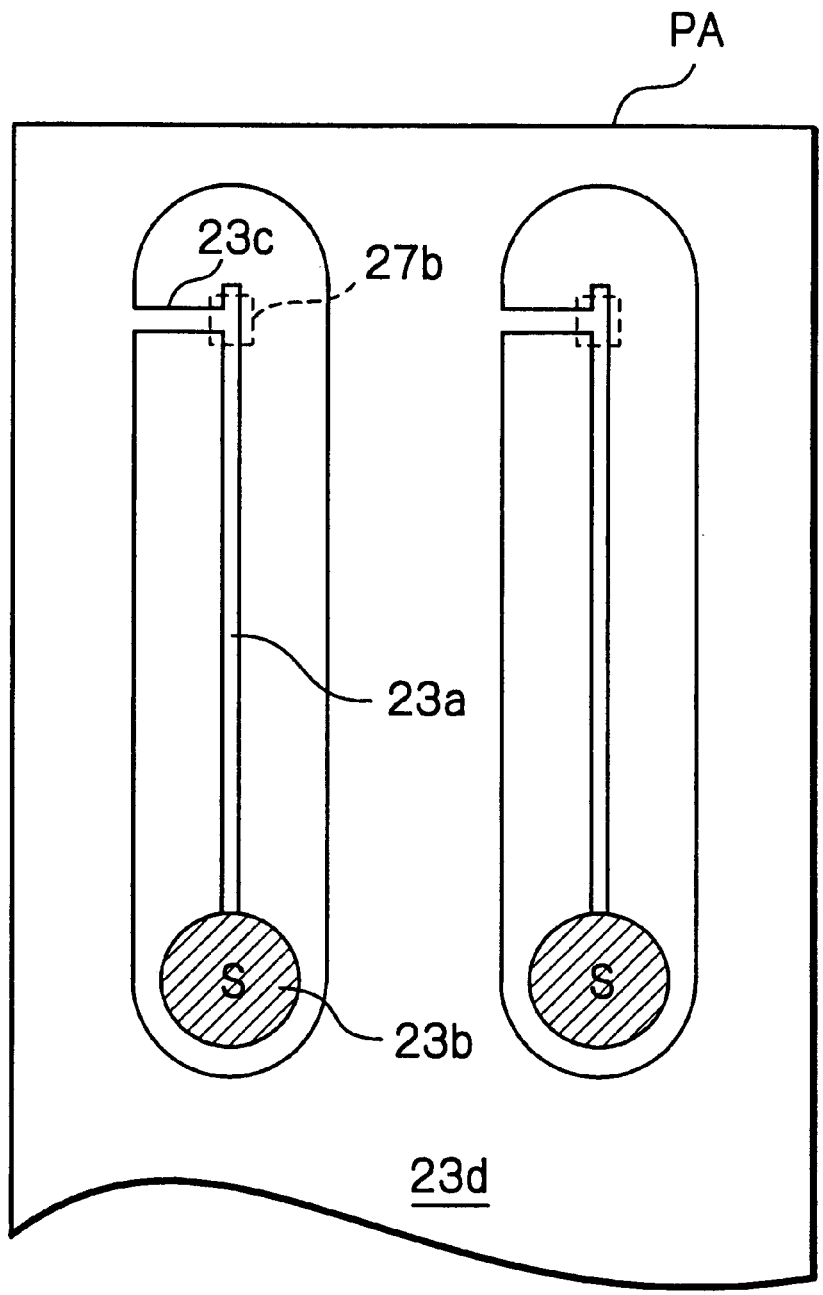
Figure 22:
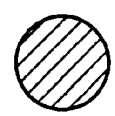
Figure 23:
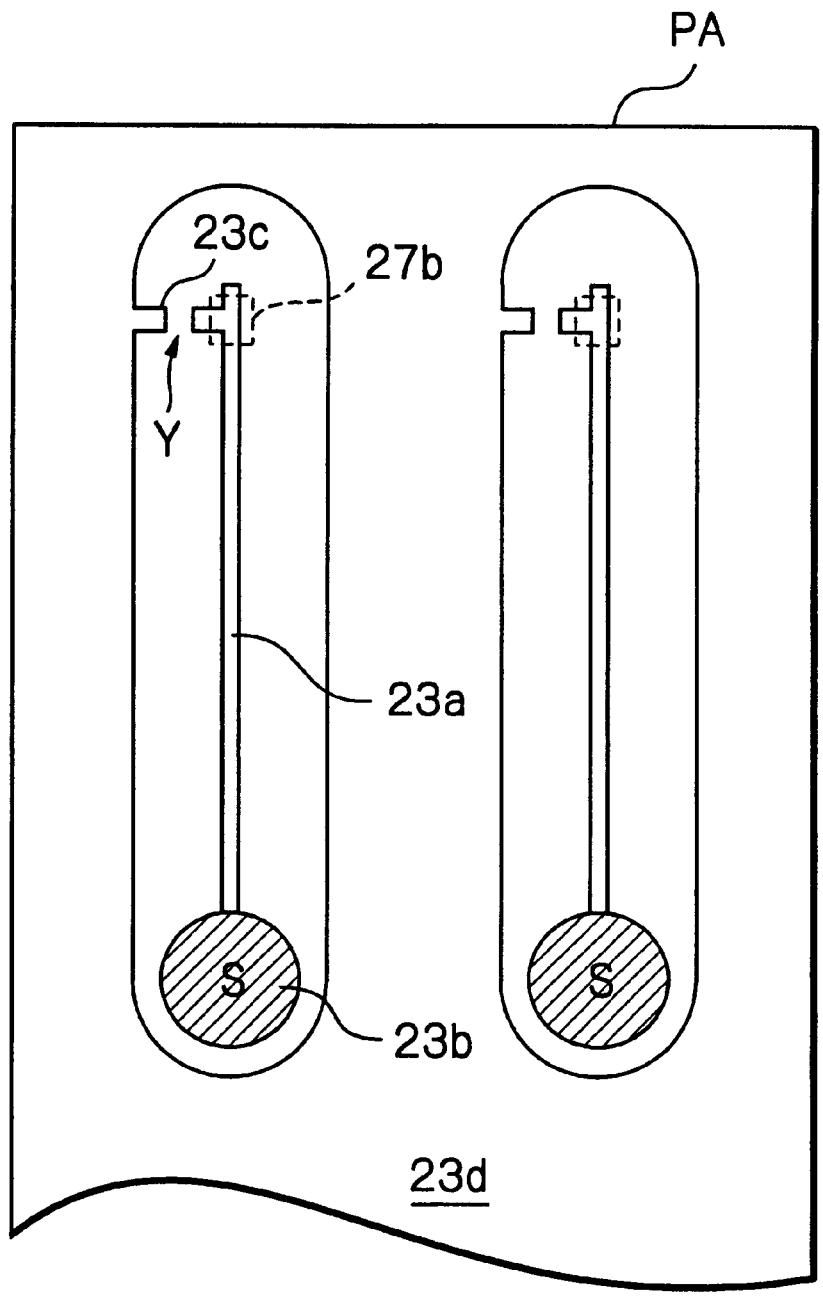

The second embodiment can be modified as illustrated in FIGS. 21, 22 and 23, which correspond to FIGS. 18, 19 and 20, respectively. That is, the plating layer 23c is connected between the ground plate 23d and a portion of the wiring layer 23a where the bump 26 will be provided.

Figure 24:
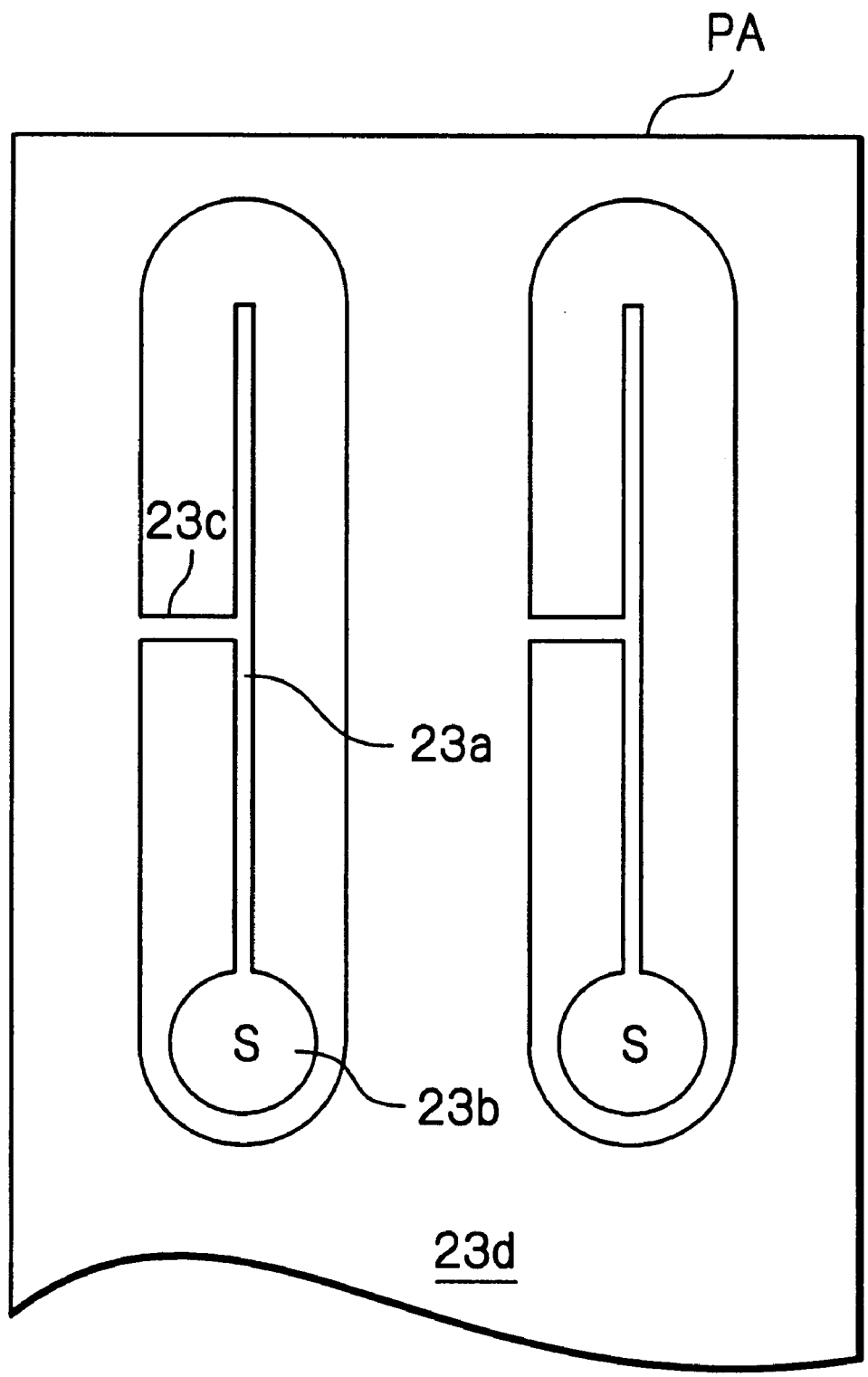
FIGS. 24, 25 and 26 are plan views illustrating other modifications of FIGS. 18, 19 and 20, respectively.
Figure 25:
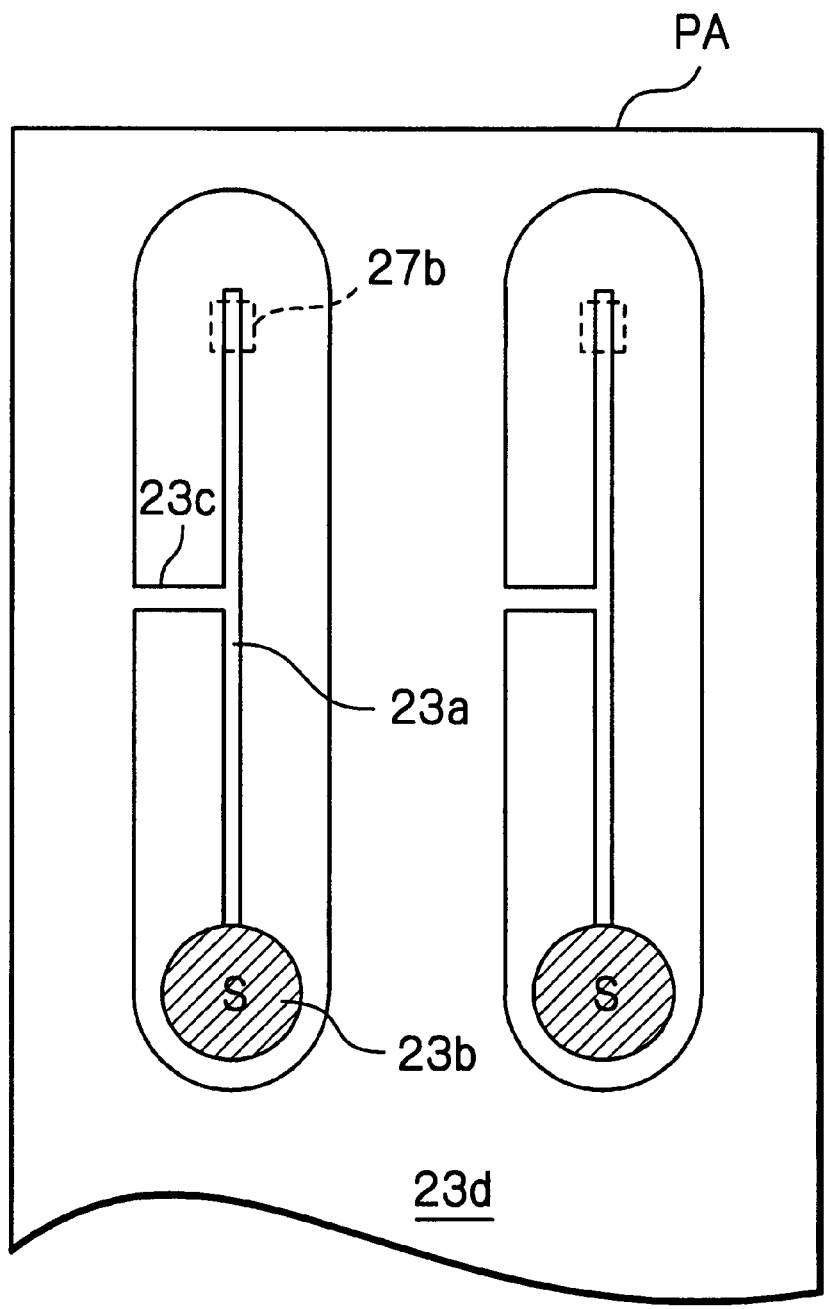
Figure 25:
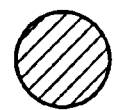
Figure 26:
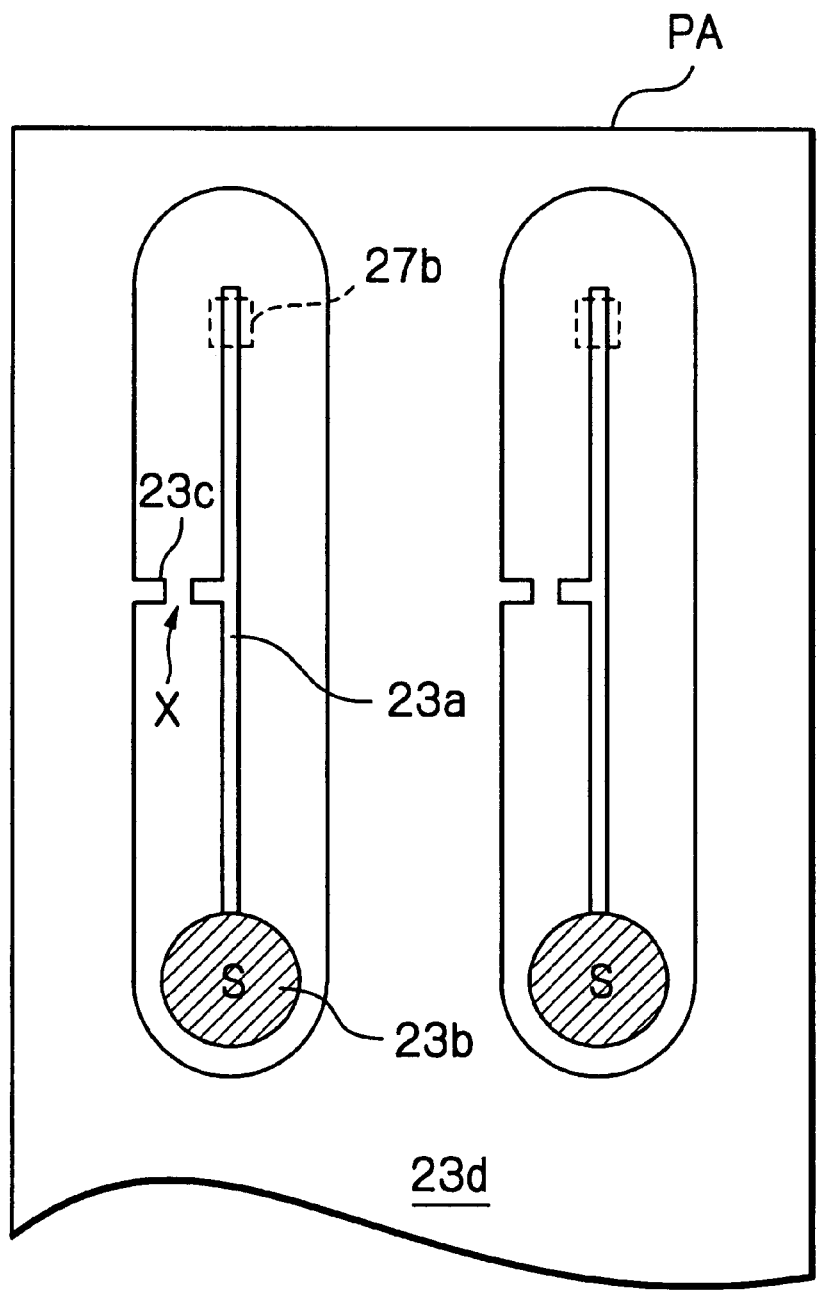
Figure 26:
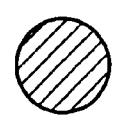

The second embodiment can be also modified as illustrated in FIGS. 24, 25 and 26, which correspond to FIGS. 18, 19 and 20, respectively. That is, the plating layer 23c is connected between the ground plate 23d and a center portion of the wiring layer 23a.

Even in the modifications, the same effect can be expected. In addition, the length L of the pattern layers 23 are equalized to homogenize the capacitance thereof, which is helpful in a high speed operation.

In the above-described embodiments, although the interposer substrate is made of single polyamide, the present invention can be applied to an interposer substrate made of other material or multi-structured materials. Additionally, the present invention can be applied to other packages than a BGA type package, such as a land grid array (LGA) type package.

As explained herein above, according to the present invention, since plating layers for supplying currents during an electroplating operation are finally terminated, even when the operation frequency of a semiconductor device is higher, the amount of signals reflected by the plating layers can be decreased. Also, since the parasitic capacitance of the plating layers is decreased, signals from the semiconductor device to its solder bumps and vice versa are hardly affected thereby.

What is claimed is:

1. A package for mounting a semiconductor device and a bump, comprising:

an interposer substrate having a first surface for mounting said semiconductor device;

a wiring layer formed on a second surface of said interposer substrate being connected to said semiconductor device;

a terminal, formed on the second surface of said interposer substrate and connected to said wiring layer, for mounting said bump;

a plating layer, formed on the second surface of said interposer substrate and connected to said terminal, said plating layer being terminated within said interposer substrate at a location to reduce parasitic capacitance of said plating layer, wherein a throughhole is provided in said interposer substrate, said plating layer being electrically terminated at said throughhole.

2. The package as set forth in claim 1, further comprising a ground plate terminated at said throughhole and at an end of said package.

3. The package as set forth in claim 1, further comprising another plating layer terminated at said throughhole and at an end of said package.

4. The package as set forth in claim 1, wherein said throughhole is adjacent to said terminal.

5. The package as set forth in claim 1, wherein said throughhole is located at a center of said package.

6. A package for mounting a semiconductor device, comprising:

an interposer substrate having first and second surfaces;

an adhesive layer directly connecting said semiconductor device to said first surface;

a wiring layer connected to said second surface;

a contact bump connecting said wiring layer to said semiconductor device through said interposer substrate and said adhesive layer;

a terminal having a first end connected to said wiring layer and being connected to said second surface;

a first plating layer, connected to said second surface and to a second end of said terminal; and a throughhole through said first plating layer, said interposer substrate and said adhesive layer.

7. The package as claimed in claim 6, wherein said throughhole is through a center of said package.

8. The package as claimed in claim 6, further comprising a second plating layer connecting said contact bump to said semiconductor device.

9. The package as claimed in claim 8, further comprising:

a solder ball; and a third plating layer, said third plating layer connecting said solder ball to said terminal.

* * * * *